United States Patent
Bartling et al.

(10) Patent No.: US 10,931,304 B1
(45) Date of Patent: Feb. 23, 2021

(54) SENSOR CONTENT ENCODING

(71) Applicant: ARM IP Limited, Cambridge (GB)

(72) Inventors: Michael Bartling, Austin, TX (US); Kevin Olen Gilbert, Austin, TX (US); James M. Brisson, Austin, TX (US)

(73) Assignee: Arm IP Limited, Cambridge (GB)

( * ) Notice: Subject to any disclaimer, the term of this patent is extended or adjusted under 35 U.S.C. 154(b) by 0 days.

(21) Appl. No.: 16/583,049

(22) Filed: Sep. 25, 2019

(51) Int. Cl.
*H03M 7/42* (2006.01)
*H03M 7/30* (2006.01)
*H04W 84/18* (2009.01)
*G06F 12/123* (2016.01)
*H04W 52/02* (2009.01)
*G06F 16/2455* (2019.01)

(52) U.S. Cl.
CPC .......... *H03M 7/42* (2013.01); *G06F 12/123* (2013.01); *G06F 16/24552* (2019.01); *H03M 7/6011* (2013.01); *H04W 52/0219* (2013.01); *H04W 84/18* (2013.01)

(58) Field of Classification Search
CPC ...... H03M 7/42; H03M 7/6011; H04W 84/18; H04W 52/0219; G06F 12/123
USPC ............................................ 341/65, 107, 106
See application file for complete search history.

(56) References Cited

U.S. PATENT DOCUMENTS

| | | | | |
|---|---|---|---|---|
| 6,940,398 B2* | 9/2005 | Li | .......... | B60Q 9/006 307/10.1 |
| 10,547,779 B2* | 1/2020 | Wan | .......... | H04N 5/23218 |
| 10,574,979 B2* | 2/2020 | Takayama | .......... | H04N 17/002 |
| 10,679,711 B2* | 6/2020 | Matsumoto | .......... | G11C 16/30 |

OTHER PUBLICATIONS

Wikipedia, "DEFLATE," https://en.wikipedia.org/wiki/DEFLATE, Oct. 5, 2020, 7 Pages.
LZ77, "The original LZ77 algorithm works as follows:," https://www.cs.helsinki.fi/u/tpkarkka/opetus/12k/dct/lecture07.pdf, Oct. 5, 2020, 10 Pages.
Wikipedia, "Ukkonen's algorithm," https://en.wikipedia.org/wiki/Ukkonen%27s_algorithm, Oct. 5, 2020, 2 Pages.
Blelloch, "Introduction to Data Compression," Computer Science Department, Carnegie Mellon University, Oct. 16, 2001, 54 Pages.

\* cited by examiner

*Primary Examiner* — Brian K Young
(74) *Attorney, Agent, or Firm* — Berkeley Law & Technology Group, LLP

(57) ABSTRACT

Disclosed are techniques for encoding a set of sensor content symbols at least in part via applying a processing window of an adjustable size.

20 Claims, 15 Drawing Sheets

SENSOR CONTENT ENCODING

BACKGROUND

Field

The present disclosure relates generally to sensor content encoding and, more particularly, to sensor content encoding via application of a processing window of an adjustable size.

Information

Integrated circuit devices, such as processors, for example, may be found in a wide range of electronic device types. For example, one or more processors may be used in computing devices, such as cellular phones, digital cameras, televisions, tablet devices, laptop computers, desktop computers, wearable devices, embedded devices, sensor nodes, endpoint devices, gateway devices, etc. Sensor nodes, gateway devices and/or other computing devices, for example, may include integrated circuit devices, such as processors, to process signals and/or states representative of diverse content types for a variety of purposes. With an abundance of diverse content being accessible, signal and/or state processing techniques continue to evolve. At times, however, processing and/or communicating signals and/or states representative of abundant and/or diverse content, for example, may prove to be relatively resource-demanding. For example, processing and/or communicating signals and/or states representative of abundant and/or diverse content may present a number of challenges related to, for example, processing resources, energy consumption, storage demands, communications network resources, complexity, cost, and/or the like.

BRIEF DESCRIPTION OF THE DRAWINGS

Claimed subject matter is particularly pointed out and distinctly claimed in the concluding portion of the specification. However, both as to organization and/or method of operation, together with objects, features, and/or advantages thereof, it may best be understood by reference to the following detailed description if read with the accompanying drawings in which:

Figure 1:
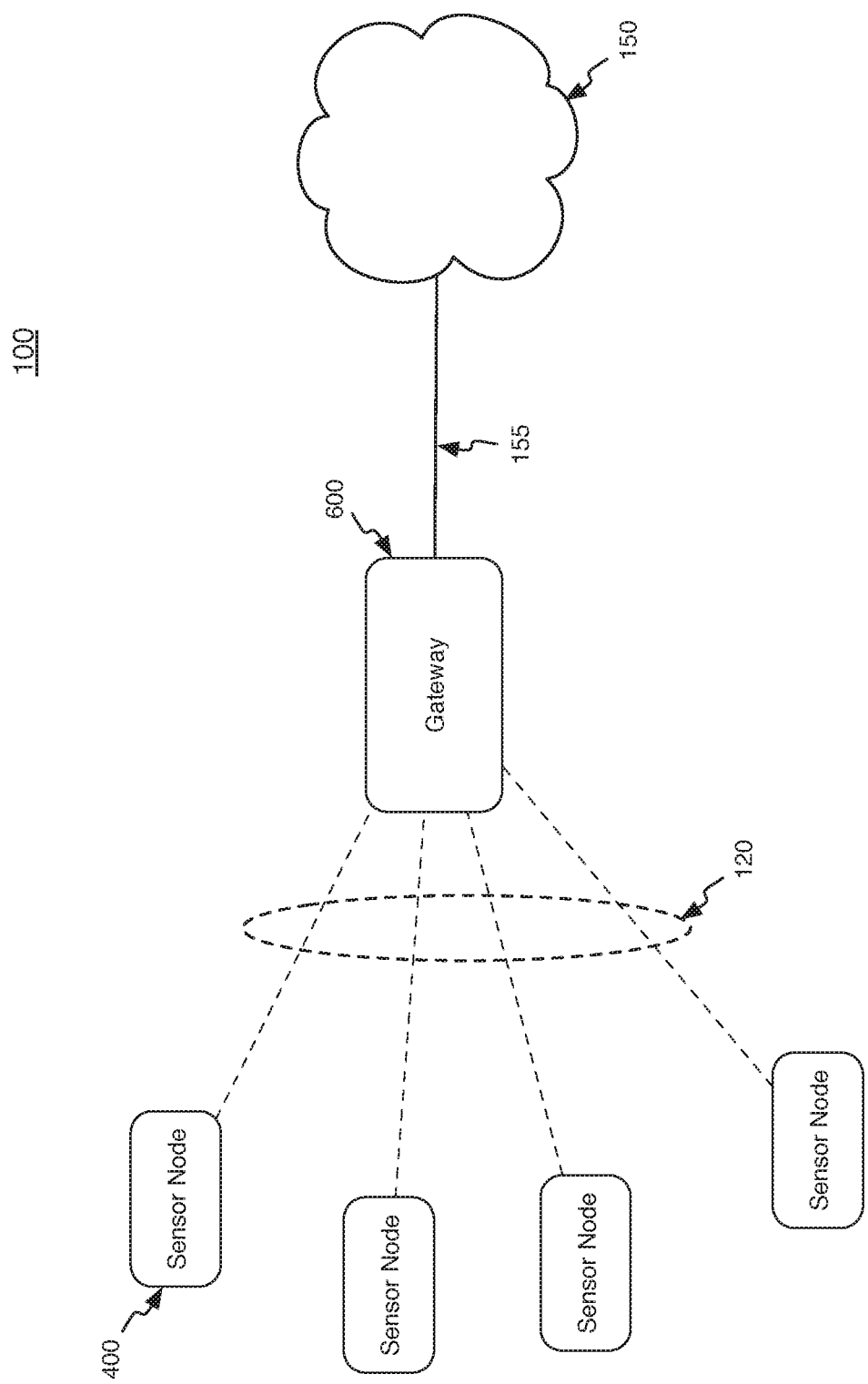
FIG. 1 is a schematic block diagram depicting an embodiment of a system including an example gateway device and example sensor nodes.

Reference is made in the following detailed description to accompanying drawings, which form a part hereof, wherein like numerals may designate like parts throughout that are corresponding and/or analogous. It will be appreciated that the figures have not necessarily been drawn to scale, such as for simplicity and/or clarity of illustration. For example, dimensions of some aspects may be exaggerated relative to others. Further, it is to be understood that other embodiments may be utilized. Furthermore, structural and/or other changes may be made without departing from claimed subject matter. References throughout this specification to "claimed subject matter" refer to subject matter intended to be covered by one or more claims, or any portion thereof, and are not necessarily intended to refer to a complete claim set, to a particular combination of claim sets (e.g., method claims, apparatus claims, etc.), or to a particular claim. It should also be noted that directions and/or references, for example, such as up, down, top, bottom, and so on, may be used to facilitate discussion of drawings and are not intended to restrict application of claimed subject matter. Therefore, the following detailed description is not to be taken to limit claimed subject matter and/or equivalents.

DETAILED DESCRIPTION

References throughout this specification to one implementation, an implementation, one embodiment, an embodiment, and/or the like means that a particular feature, structure, characteristic, and/or the like described in relation to a particular implementation and/or embodiment is included in at least one implementation and/or embodiment of claimed subject matter. Thus, appearances of such phrases, for example, in various places throughout this specification are not necessarily intended to refer to the same implementation and/or embodiment or to any one particular implementation and/or embodiment. Furthermore, it is to be understood that particular features, structures, characteristics, and/or the like described are capable of being combined in various ways in one or more implementations and/or embodiments and, therefore, are within intended claim scope. In general, of course, as has always been the case for the specification of a patent application, these and other issues have a potential to vary in a particular context of usage. In other words, throughout the patent application, particular context of description and/or usage provides helpful guidance regarding reasonable inferences to be drawn; however, likewise, "in this context" in general without further qualification refers to the context of the present patent application.

As mentioned above, integrated circuit devices, such as processors, for example, may be found in a wide range of electronic device types. For example, one or more processors may be used in computing devices, such as cellular phones, digital cameras, televisions, tablet devices, laptop computers, desktop computers, wearable devices, embedded devices, sensor nodes, endpoint devices, gateway devices, etc. Sensor nodes, gateway devices and/or other computing devices, for example, may include integrated circuit devices, such as processors, to process signals and/or states representative of diverse content types for a variety of purposes. With an abundance of diverse content being accessible, signal and/or state processing techniques continue to evolve. At times, however, processing and/or communicating signals and/or states representative of abundant and/or diverse content, for example, may prove to be relatively resource-demanding. For example, processing and/or communicating signals and/or states representative of abundant and/or diverse content may present a number of challenges related to, for example, processing resources, energy consumption, storage demands, communications network resources, complexity, cost, and/or the like.

For example, consider a situation wherein it may be desirable to collect content (e.g., signals and/or states) from a number of geographically distributed sensor nodes. As utilized herein, "content," "digital content," and/or similar terms are meant to refer to signals and/or states in a physical format, such as a digital signal and/or digital state format, e.g., that may be perceived by a user if displayed, played, tactilely generated, etc. and/or otherwise executed by a device, such as a digital device, including, for example, a computing device, but otherwise might not necessarily be readily perceivable by humans (e.g., if in a digital format). Likewise, in the context of the present patent application, digital content provided to a user in a form so that the user is able to readily perceive the underlying content itself (e.g., content presented in a form consumable by a human, such as hearing audio, feeling tactile sensations and/or seeing images, as examples) is referred to, with respect to the user, as "consuming" digital content, "consumption" of digital content, "consumable" digital content and/or similar terms. Further, as utilized herein, "sensor" and/or the like refers to an electronic and/or computing device that may generate one or more signals and/or signal packets, for example, in response to one or more stimuli (e.g., one or more physical phenomena). In an embodiment, sensors may include, to name a few non-limiting examples, one or more radio frequency sensors/transceivers, cameras, microphones, accelerometers, altimeters, gyroscopes, compasses, thermometers, magnetometers, barometers, light sensors, biometric sensors or proximity sensors, or any combination thereof. Further, "sensor node" and/or the like refers to an electronic and/or computing device that may include one or more sensors and/or may process signals and/or signal packets obtained from one or more sensors. In particular implementations, a sensor node may comprise, for example, an endpoint or like device that may communicate with one or more computing devices over one or more wired and/or wireless-type connections using one or more appropriate and/or applicable communication protocols.

In one particular example, a number of sensor nodes may be geographically distributed in an area. Individual sensor nodes may communicate, such as wirelessly (e.g., via long range wide area network (LoRaWAN)) to a gateway device that may accumulate sensor content obtained from various sensor nodes and/or may bundle sensor content for processing and/or communication (e.g., cellular communication) with one or more network devices over a network (e.g., Internet), for example. As utilized herein, "gateway device" refers to an electronic and/or computing device that may obtain content (e.g., signals and/or states) from one or more sensor nodes and/or may decode and/or encode sensor node content for communication between a gateway device and one or more network devices.

In some implementations, sensor nodes may comprise, for example, relatively small devices with relatively limited energy and/or computing resources. In some instances, such as for sensor nodes utilizing LoRaWAN and/or similar communication protocol, for example, for communication between sensor node and gateway device, relatively little bandwidth may be available. It may therefore be beneficial to enhance efficiency (e.g., reduce bandwidth utilization, etc.) of communication between sensor nodes and a gateway device. It may further be advantageous to enhance computing resource utilization efficiency in order to reduce power consumption and/or to extend battery life, for example. Additionally, in some implementations, a gateway device may communicate with a network device over a metered connection. It may therefore be beneficial to enhance efficiency (e.g., reduce bandwidth utilization) of communications between a gateway device and a network device. It may further be advantageous to provide such enhancements while promoting more reliable and/or more robust functionality for sensor nodes and/or gateway devices, for example. Also, for example, it may be advantageous to provide for efficient, reliable, and/or robust communication from sensor nodes, for example, to other networked computing devices (e.g., via a gateway device) in a manner that may allow for decoding of encoded content utilizing relatively widely available and/or "off-the-shelf" tools.

FIG. 1 is a schematic block diagram depicting an embodiment 100 of a system including an example gateway device 600 and example sensor nodes 400. In a particular implementation, sensor nodes 400 may communicate with gateway device 600 via one or more wired and/or wireless connections 120. In a particular implementation, one or more connections 120 may comprise a wireless connection, such as may be compliant with and/or compatible with a LoRaWAN-type communication protocol, for example, although claimed subject matter is not limited in scope in this respect. Further, in a particular implementation, gateway device 500 may communicate with one or more network devices of a network 150 via a wired and/or wireless connection 155. For example, network 150 may comprise the Internet, and/or connection 155 may comprise a cellular connection, although, again, claimed subject matter is not limited in scope in these respects. Additional non-limiting examples of wired and/or wireless communications protocols that may be utilized by sensor nodes 400 and/or by gateway device 600, for example, are mentioned below.

In particular implementations, sensor nodes 400 may comprise "Internet of Things" (IoT)-type devices. In particular implementations, electronic devices, such as, for example, embedded computing devices, may leverage existing Internet and/or like infrastructure as part of a so-called "Internet of Things" (IoT), such as via a variety of protocols, domains, and/or applications. IoT may typically comprise a system of interconnected and/or internetworked physical computing devices capable of being identified, such as uniquely via an assigned Internet Protocol (IP) address, for example. Electronic devices, such as IoT-type devices, for example, may include computing resources embedded into hardware so as to facilitate and/or support a device's ability to acquire, collect, process and/or transmit content over one or more communications networks. In this context, "IoT-type devices" and/or the like refer to one or more electronic and/or computing devices capable of leveraging existing Internet and/or like infrastructure as part of the IoT, such as via a variety of applicable protocols, domains, applications, etc. In particular implementations, IoT-type devices, for example, may comprise a wide variety of embedded devices, such as, for example, automobile sensors, biochip transponders, heart monitoring implants, thermostats, kitchen appliances, locks or like fastening devices, solar panel arrays, home gateways, controllers, and/or the like. Although embodiments described herein may refer to IoT-type devices, claimed subject matter is not limited in scope in these respects. For example, although IoT-type devices may be described, claimed subject matter is intended to include use of any of a wide range of electronic device types, including a wide range of computing device types. Also, in particular implementations, sensor nodes 400 may be employed in a wide range of applications. For example, by way of non-limiting examples, sensor nodes 400 may include seismographic monitoring devices, pipeline integrity monitoring devices, household appliance monitoring devices, cattle and/or other livestock monitoring devices (e.g., ear tags), agricultural monitoring devices (e.g., crop monitoring), biomedical monitoring devices, electrical grid monitoring devices, etc.

Further, in particular implementations, individual sensor nodes 400 may obtain content (e.g., signals and/or signal packets) from one or more sensors. In particular implementations, sensor nodes 400 may encode sensor content and may transmit encoded sensor content via signals and/or signal packets to gateway device 600 via connection 120. In a particular implementation, sensor nodes 400 may encode sensor content such that encoded content may be decoded using techniques substantially compatible and/or compliant with an LZ77-type protocol (see, e.g., Ziv, Jacob; Lempel, Abraham (May 1977). "A Universal Algorithm for Sequential Data Compression". *IEEE Transactions on Information Theory.* 23 (3) 337-343), although claimed subject matter is not limited in scope in this respect. In other implementations, techniques compatible and/or compliant with an LZ78-type protocol (see, e.g., Ziv, Jacob; Lempel, Abraham (September 1978). "Compression of Individual Sequences via Variable-Rate Coding". *IEEE Transactions on Information Theory.* 24 (5) 530-536) and/or other suitable protocols (e.g., Golomb Rice, LZSS, etc.) may be utilized, in whole or in part.

Further, in a particular implementation, gateway device 600, for example, may gather sensor content from a number of sensor nodes 400, and/or may encode sensor content according to an encoding protocol to enhance efficient communication of sensor code over connections 155 and/or over network 150. For example, sensor content from various sensor nodes may be encoded at gateway device 600 utilizing a protocol compliant and/or compatible with a Huffman-type encoding protocol. For purposes of explanation, Huffman-type encoding may refer to variable length and/or prefix-free encoding in which a bit string representing a particular symbol is never a prefix of a bit string representing another particular symbol, for example. In this context, a combination of LZ77-type encoding and Huffman-type encoding may be referred to as DEFLATE-type encoding, for example. In a particular implementation, DEFLATE-type encoding, for example, may be distributed among sensor nodes 400 and gateway device 600, as described more fully below. Of course, claimed subject matter is not limited in scope to the particular example protocols described herein. In a particular implementation, by partitioning DEFLATE-type encoding and/or other suitable encoding techniques across sensor nodes 400 and/or gateway device 600, significant or otherwise suitable compression may be achieved along with attendant reductions in bandwidth utilization, for example, without unduly burdening relatively resource-constrained endpoint devices, such as sensor nodes 400, for example. In particular implementations, bandwidth reductions may be achieved for communication between sensor nodes 400 and gateway device 600 and/or between gateway device 600 and network 150.

In a particular implementation, gateway device 600 may not be as resource-constrained as a sensor node, and/or a significant portion of the encoding burden may be passed on to the gateway device. As mentioned, in at least one implementation, sensor nodes 400, for example, may implement a portion of DEFLATE-type encoding related to LZ77-type encoding and/or gateway device 600 may implement another portion of DEFLATE-type encoding related to Huffman-type encoding, for example. For circumstances in which gateway device 600 may communicate with a network, such as network 150, via a metered connection, such as connection 155, a reduction in bandwidth utilization realized through example encoding implementations described herein may result in reduced costs, for example. IoT devices, such as sensor nodes 400, for example, may not have sufficient on-chip memory and/or other computing-related resources to fully implement, by themselves, sufficiently effective coding techniques to yield similar reductions in costs in some circumstances. On the other hand, by implementing an encoding technique that would allow decoding with techniques compliant and/or compatible with LZ77, LZ78, and/or other suitable encoding techniques, endpoint devices, such as IoT devices and/or sensor nodes, for example, may more efficiently communicate with a gateway device and/or may make relatively more efficient utilization of available processing, storage, and/or energy resources. Additionally, in a particular implementation, by partitioning DEFLATE-type encoding techniques across endpoint devices and/or gateway devices, for example, multiple streams and/or sets of sensor content may be accommodated, as more fully described below.

Figure 2:
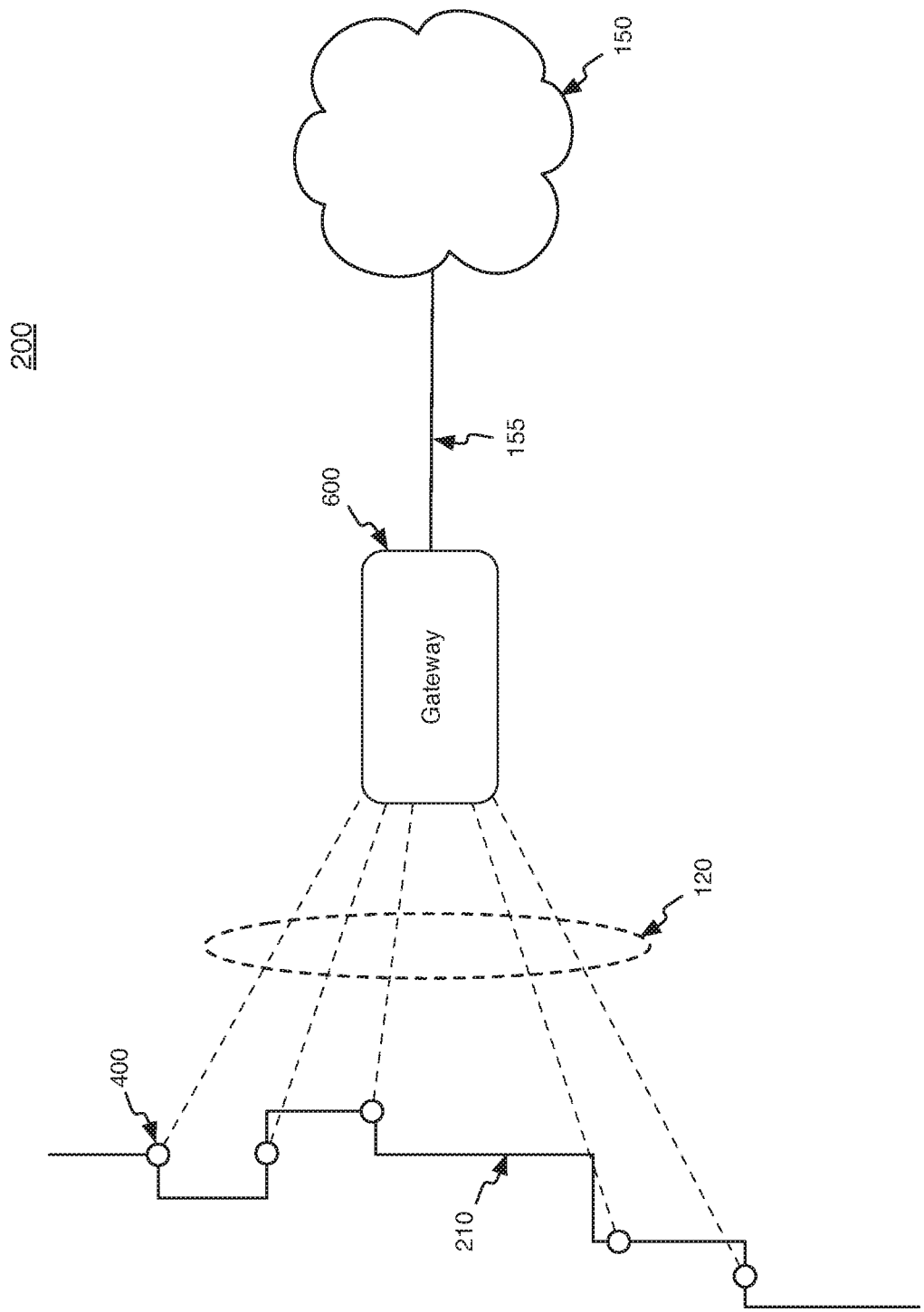
FIG. 2 is a schematic block diagram illustrating an embodiment of a system including an example gateway device and example sensor nodes.

FIG. 2 is a schematic block diagram illustrating an embodiment 200 of a system including example gateway device 600 and example sensor nodes 400. In a particular implementation, sensor nodes 400 may comprise, for example, monitoring devices arranged along a pipeline 210 (e.g., gas pipeline, oil pipeline, water supply pipeline, etc.) that may extend over a relatively larger geographic area. In another particular implementation, sensor nodes 400 may be arranged along a geological faultline, for another non-limiting example. In a particular implementation, sensor nodes 400 may obtain content (e.g., signals and/or signal packets), from one or more sensors. For example, sensor nodes 400 may obtain and/or encode content from seismographic sensors positioned along particular stretches of a faultline and/or pipeline, such as 210, for example. Further, for a particular implementation, gateway device 600 may obtain sensor content from sensor nodes 400 via a wireless LoRaWAN connection 120, for example. Also, for a particular implementation, gateway device 600 may subsequently further encode sensor content to enable communication of sensor content between gateway device 600 and network 150. As discussed more fully below, a gateway device, such as gateway device 600, may encode sensor content using a protocol compatible and/or compliant with a Huffman-type encoding protocol, for example.

Figure 3:
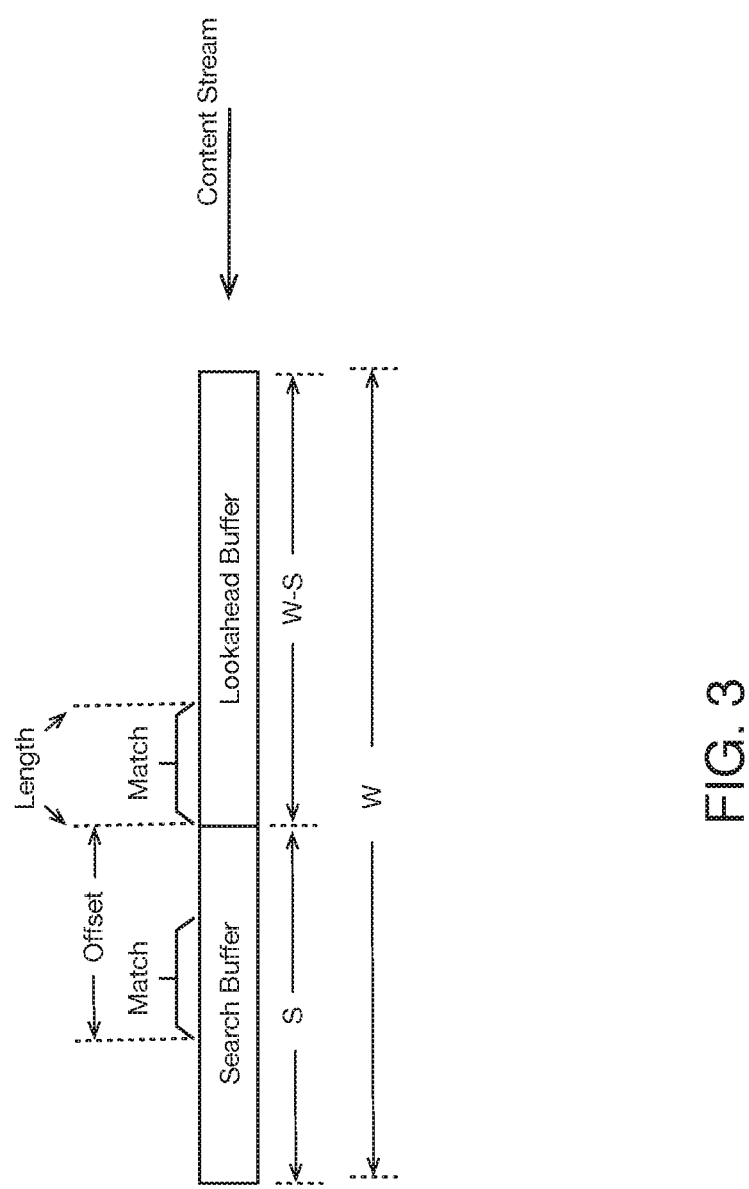
FIG. 3 is a schematic block diagram illustrating an example search buffer and example lookahead buffer, in accordance with an embodiment.

FIG. 3 is a schematic block diagram illustrating an example search buffer and example lookahead buffer, in accordance with an embodiment. In particular implementations, a search buffer and/or lookahead buffer may be utilized, at least in part, as memory or like caches in connection with an LZ77-type encoding protocol, for example. In a particular implementation, an example encoding technique, such as may be performed by a sensor node 400 of FIGS. 1 and/or 2, for example, may analyze an incoming set of content, such as sensor content, for example, to determine how to reduce the size of the content to promote more efficient processing, storage, and/or communication of the content. In some instances, content size may be reduced, for example, by replacing redundant content with appropriate metadata (e.g., content descriptive of other content). For example, sections of a set of content may be identical to other sections of the set of content. Rather than repeat a communication and/or storage of identical sections, for example, one or more of the identical sections may be represented by metadata content, such as symbols and/or pointers, for example, that may refer to a previously-communicated identical section, in a particular implementation.

For a particular encoding example, a set of content may be encoded into a series of sets of parameters, wherein individual sets of parameters may include an offset, length pair [o, l] pointing to a previously encoded portion of a set of content and/or a "literal" parameter. "Literal" in this context refers to a particular symbol itself, rather than an offset, length pair and/or other pointer referring to a particular previously encoded symbol, for example. In a particular implementation, a sliding window of size "W" may operate over a set of content, as depicted in FIG. 3, for example. A search buffer of size "S," depicted in FIG. 3, may span a portion of an incoming set of content that may have been previously encoded, if any, for example. FIG. 3 further depicts a lookahead buffer of size "W-S." In a particular implementation, offset parameter "o" may comprise, for example, a pointer into the search buffer, thereby indicating a position (e.g., a virtual and/or physical address, space, etc.) at which a match may be found, as depicted in FIG. 3. Also, for a particular implementation, length parameter "l" may indicate a length of a matched symbol and/or series of symbols, as also depicted in FIG. 3. As discussed more fully below, in some instances, parameter W may be determined and/or specified dynamically in a particular implementation. That is, for a particular implementation, window size "W" may change responsive to coding conditions (e.g., available bandwidth, available memory resources, available processing resources, etc.) and/or based, at least in part, on an explicitly specified parameter, for example. In a particular coding example, a window may be empty at the start of a coding sequence and/or may grow to size W as a set of content is processed. Once a window reaches size W, the window may slide along to cover different portions of an incoming set of content, as demonstrated in the following non-limiting example. As explained more fully below, at times, a search buffer may include a suffix tree and/or least-recently used (LRU) cache contained in a memory device of a sensor node 400, for example. Thus, for a particular implementation, window size W may depend, at least in part, on available memory resources, for example.

For a particular encoding example, a simplified example set of content may include symbols, such as, for example, sensor content symbols "A, A, B, C, B, B, A, B, C, . . . ". Of course, sets of content may include any of a wide range of possible symbols and/or symbol types, for example. Sets of content may further vary widely in terms of size, for example. In a particular implementation, a set of content may comprise sensor content obtained at a particular sensor node 400. For the present example, individual symbols, such as A, B, and/or C for example, may represent respective bytes of sensor content, although claimed subject matter is not limited in scope in these respects.

For a particular coding example, a search buffer may have a size S of seven bytes and a window may have a size W of thirteen bytes, yielding a six byte lookahead buffer. Of course, these parameters are merely illustrative, and claimed subject matter is not limited in scope in these respects. Table 1, below, depicts a portion of a set of content undergoing processing, wherein a search buffer may be empty because, for example, a new frame of content is being encoded (e.g., previous search buffer contents having been flushed). In a particular implementation, a lookahead buffer may contain a portion of the incoming set of content:

TABLE 1

| Example sensor content encoding | |
| --- | --- |
| Search buffer | Lookahead buffer |
| | A  A  B  C  B  B  A  B  C |

To encode symbol "A" positioned at the 1st entry of a lookahead buffer, as indicated in Table 1, a search may be made of the search buffer, wherein, for the present example, no match may be found. In a particular implementation, due at least in part to no match being found, literal symbol "A" along with an offset, length pair of [0,0] (e.g., [0,0] pair indicating a literal symbol) may be added to a set of output content. See Table 8 below, depicting an example set of output content. For the present coding example, a sliding window (e.g., including search buffer and lookahead buffer) may advance a position and/or a new search may be performed, as depicted, for example, in Table 2:

TABLE 2

| Example sensor content encoding | |
| --- | --- |
| Search buffer | Lookahead buffer |
| A | A  B  C  B  B  A  B  C |

For the present coding example, symbol "A" may be positioned at the beginning of the lookahead buffer. A search may be made of the search buffer, wherein a match for "A" may be found at offset 1 (e.g., one position into the search buffer). An additional check may be made for the next symbol in the lookahead buffer to see if there is a match for two consecutive symbols "A" and "B." Because, for example, no match for multiple symbols is found, length parameter l may be set to "1". Thus, an offset, length pair of [1, 1] may be added to a set of output content, for example.

See Table 8, below, depicting an example set of output content for the present coding example. For the present coding example, the sliding window may advance another position (e.g., advance according to length parameter), as depicted in Table 3, for example:

TABLE 3

Example sensor content encoding

| Search buffer | Lookahead buffer |
|---|---|
| A  A  B  C | B  B  A  B  C |

For the present coding example, symbol "B" may be positioned at the beginning of the lookahead buffer. A search may be made of the search buffer, wherein a match for "B" may not be found, for the present example. In a particular implementation, due at least in part to no match being found, literal symbol "B" along with an offset, length pair of [0,0] may be added to a set of output content. See Table 8 below. For the present coding example, the sliding window may advance another position, as depicted in Table 4, for example:

TABLE 4

Example sensor content encoding

| Search buffer | Lookahead buffer |
|---|---|
| A  A  B  C  B | B  A  B  C |

For the present coding example, symbol "C" may now be positioned at the beginning of the lookahead buffer. A search may be made of the search buffer, wherein a match for "C" may not be found, for the present example. In a particular implementation, due at least in part to no match being found, literal symbol "C" along with an offset, length pair of [0,0] may be added to a set of output content. See Table 8 below. For the present coding example, the sliding window may advance another position, as depicted in Table 5, for example:

TABLE 5

Example sensor content encoding

| Search buffer | Lookahead buffer |
|---|---|
| A  A  B  C | B  B  A  B  C |

For the present coding example, symbol "B" may be positioned at the beginning of the lookahead buffer. A search may be made of the search buffer, wherein a match for "B" may be found at offset 2 (e.g., two positions into the search buffer). An additional check may be made for the next symbol in the lookahead buffer to see if there is a match for two consecutive symbols "B" and "B" (next symbol in lookahead buffer). Because for the present example no match for multiple symbols may be found, length parameter l may be set to "1". Thus, an offset, length pair of [2, 1] may be added to a set of output content. See Table 8, below, depicting an example set of output content for the present coding example. For the present coding example, the sliding window may advance another position (e.g., advance according to length parameter), as depicted in Table 6, for example:

TABLE 6

Example sensor content encoding

| Search buffer | Lookahead buffer |
|---|---|
| A  A  B  C  B | B  A  B  C |

For the present coding example, symbol "B" may be positioned at the beginning of the lookahead buffer. A search may be made of the search buffer, wherein a match for "B" may be found at offset 3 and also at offset 1. An additional check may be made for the next symbol in the lookahead buffer to see if there is a match for two consecutive symbols "B" and "A" (next symbol in lookahead buffer). Because for the current example no match for multiple symbols may be found, length parameter l may be set to "1". Thus, an offset, length pair of [1, 1] may be added to a set of output content. See Table 8, below, depicting an example set of output content for the present example. For the present coding example, the sliding window may advance another position (e.g., advance according to length parameter), as depicted in Table 7, for example:

TABLE 7

Example sensor content encoding

| Search buffer | Lookahead buffer |
|---|---|
| A  A  B  C  B  B | A  B  C |

For the present coding example, symbol "A" may be positioned at the beginning of the lookahead buffer. A search may be made of the search buffer, wherein a match for "A" may be found at offset 6 and also at offset 5, for example. An additional check may be made for the next symbol in the lookahead buffer to see if there is a match for two consecutive symbols "A" and "B" (next symbol in lookahead buffer). A match for A, B may be found at offset 5, for example. An additional search may indicate that a match may also found for consecutive lookahead buffer symbols A, B, C at offset 5, for example. Therefore, for the present example, with three consecutive symbols in a match, length parameter l may be set to "3". Thus, for the present coding example, an offset, length pair of [5, 3] may be added to a set of output content, as indicated at Table 8, below.

TABLE 8

Example encoded output content
Encoded Output Content

[0, 0, A]
[1, 1]
[0, 0, B]
[0, 0, C]
[2, 1]
[1, 1]
[5, 3]

Of course, the preceding coding example is merely an example, and claimed subject matter is not limited in scope in these respects. Other implementations may accommodate much larger sets and/or streams of sensor content, for example, and/or may implement relatively much larger search buffers and/or lookahead buffers, for example.

As seen in the discussion above, an example encoding technique may include encoding suffixes recursively as an offset, length pair and/or as an offset, length, literal tuple, in a particular implementation. "Suffix" and the like in this context refers to a subset of a set of content and/or content stream (e.g., one or more symbols and/or parameters). By encoding suffixes, for a particular implementation, compressed content may comprise content literals and/or pointers to previously encoded content, removing a need to deliver a separate dictionary to a decoding device in order to enable decoding of content, for example. In a particular implementation, a suffix tree may be implemented, at least in part, in which an index of a current symbol may be utilized to build a suffix tree containing a range of indices for possible suffixes having previously passed through the sliding window. Briefly, for purposes of explanation, a "suffix tree" typically refers to an ordered content structure containing suffixes that may be compressed, for example. In a particular implementation, a size of a suffix tree may correspond at least in part to a relative offset component of one or more suffix tuples. If a size of a suffix tree is fixed, for example, window size may be accordingly fixed and/or bound, in a particular implementation. In some instances, such a feature may advantageously provide for adjustment of a memory footprint to fit any or most device types, for example. Additionally, in particular implementations, window size may be scaled up and/or down depending at least in part on available power and/or available bandwidth, for example. For devices utilizing LZ77 encoding, for example, there may be no bound on a size of a suffix tree in memory, which may be problematic or challenging for running such encoding techniques on embedded and/or other lower-power devices, for example.

Further, in a particular implementation, suffix tree memory storage may be implemented, at least in part, as a least-recently used cache that may be pruned and/or rebalanced responsive to the cache being full, as more fully explained below. In a particular implementation, by fixing a window to different sizes, tradeoffs may be made between compression ratio and memory footprint, for example.

Figure 4:
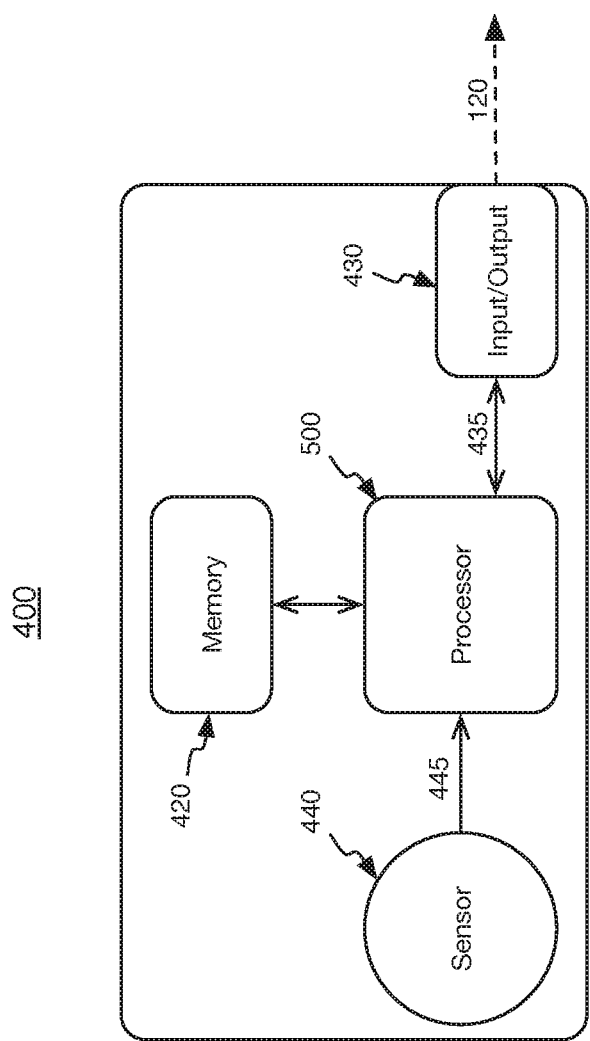
FIG. 4 is a schematic block diagram depicting an embodiment of an example sensor node.

FIG. 4 is a schematic block diagram depicting an embodiment 400 of an example sensor node. In particular implementations, sensor node 400 may include one or more processors 500, which may comprise, for example, one or more embedded controllers, microprocessors, microcontrollers, application specific integrated circuits, digital signal processors, programmable logic devices, field programmable gate arrays, etc., or any combination thereof. Sensor node 400 may also include a memory 420 and/or an input/output circuit 430, in a particular implementation. Of course, sensor node 400 is merely an example implementation, and claimed subject matter is not limited in scope to the particular functional units, devices, and/or configuration described.

In a particular implementation, sensor node 400 may incorporate one or more sensors 440. However, in other particular implementations, sensor node 400 may obtain sensor content (e.g., signals and/or signal packets representative of sensor content) from one or more externally-positioned sensors (i.e., implemented, at least in part, as a separate device from sensor node 400). Input/output unit 430, for a particular implementation, may comprise a transceiver capable of communicating between sensor node 400 and a gateway device, such as gateway device 600, for example. In a particular implementation, input/output unit 430 may communicate via wireless connection, such as a LoRaWAN compatible and/or compliant connection, and/or may communicate via a communication protocol compliant and/or compatible with IP.

Figure 5:
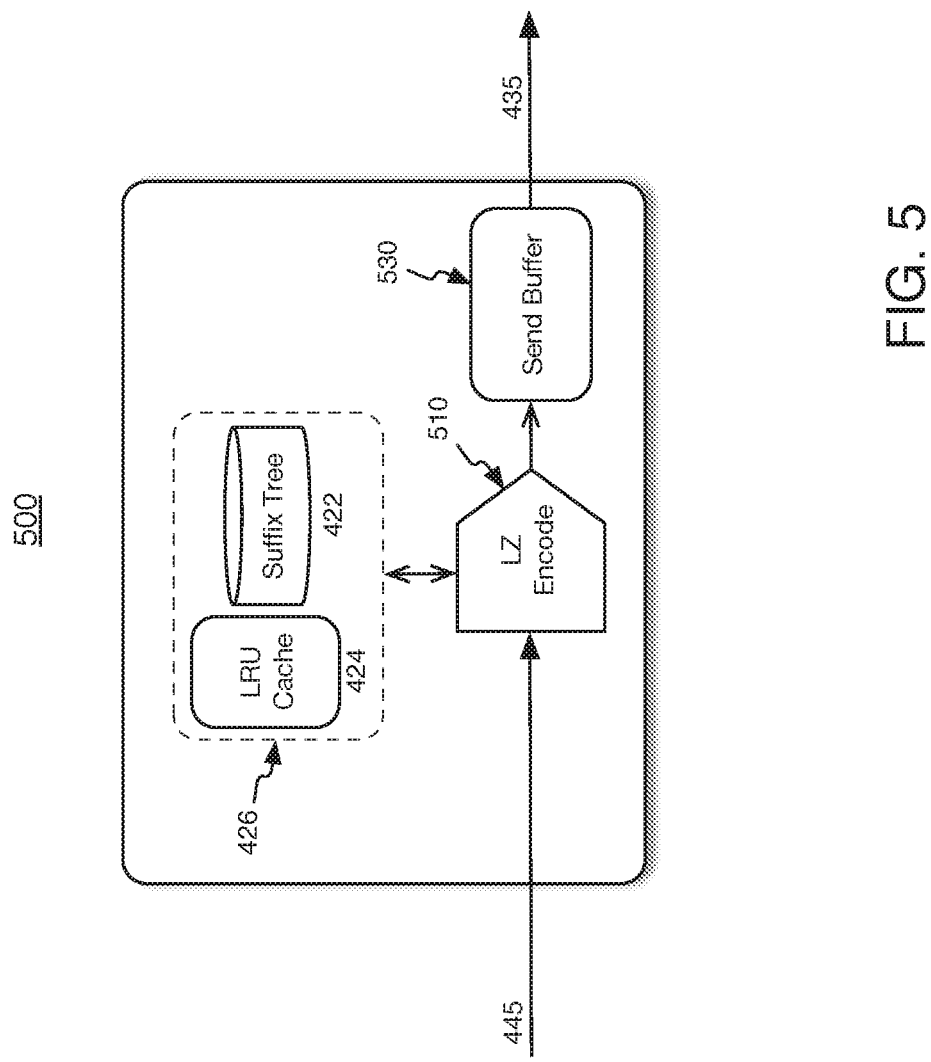
FIG. 5 is a schematic block diagram illustrating an embodiment of an example sensor node processor.

FIG. 5 is a schematic block diagram illustrating an embodiment 500 of an example processor for sensor node 400. In a particular implementation, processor 500 may include circuitry 510 to perform encoding of sensor content, such as sensor content 445. In a particular embodiment, circuitry 510 may include programmable execution units that may execute software, firmware, and/or hardwired instructions to encode sensor content 445. Further, in a particular implementation, a memory, such as memory 420, may be implemented, at least in part, on a particular semiconductor die along with processor 500. However, claimed subject matter is not limited in scope in these respects. In a particular embodiment, memory 420 may contain a suffix lookup structure 426, including a least-recently used (LRU) cache 424 and/or a suffix tree 422 suitable for coding operations described herein. Although particular implementations described herein may utilize a suffix tree, claimed subject matter is not limited in scope in these respects. For example, other suffix lookup structures may be utilized including, by way of non-limiting example, a suffix array structure and/or a hash table and/or the like. Additionally, in a particular implementation, LRU cache 422 may be implemented, at least in part, as a cache for suffix tree 422, wherein LRU cache 422 may tend to contain more frequently searched suffix parameters, as discussed more fully below.

Further, memory 420 may comprise volatile and/or non-volatile memory types, for example. In a particular implementation, processor 500 may perform coding operations related to sensor nodes and/or other endpoint devices, such as those described herein. Send buffer 530 may communicate encoded sensor content 435 with input/output unit 430, in a particular implementation. Of course, processor 500 is merely an example implementation, and claimed subject matter is not limited in scope to the particular functional units, devices, and/or configuration described. Additional computing devices capable of executing instructions to perform operations such as those described herein are described below.

Figure 6:
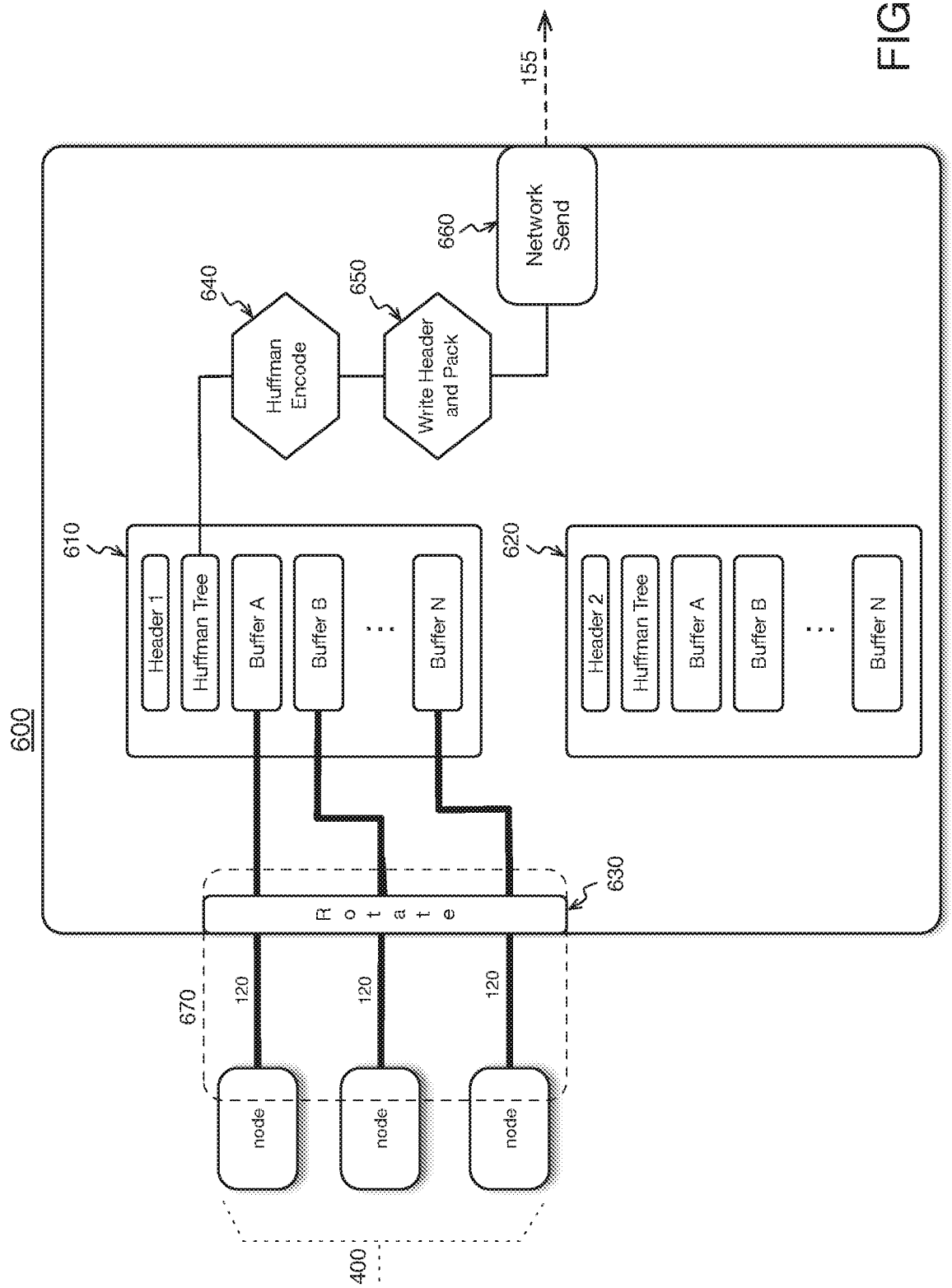
FIG. 6 is a schematic block diagram illustrating an embodiment of an example gateway device.

FIG. 6 is a schematic block diagram illustrating an embodiment 600 of an example gateway device. In a particular implementation, sensor nodes 400 are depicted in FIG. 6 as providing content (e.g., signals and/or signal packets) via connection(s) 120 to gateway device 600. In a particular implementation, gateway device 600 may obtain multiple sets of content and/or multiple content streams from multiple sensor nodes 400 concurrently and/or serially, for example. Gateway device may comprise a plurality of memory structures that may be implemented, at least in part, in one or more physical memory devices. For example, gateway device 600 may incorporate at least a first sensor content archive 610 and a second sensor content archive 620 in a particular implementation. Individual sensor content archives, such as archives 610 and/or 620, may store header content, Huffman tree content, and/or one or more buffers to store content obtained from sensor nodes 400, in a particular implementation, although claimed subject matter is not limited in scope in these respects.

In a particular implementation, sensor content obtained from sensor nodes 400 may be received at gateway device via a rotate unit 630. In a particular embodiment, rotate unit 630 may comprise a rotating file buffer. Further, in a particular implementation, rotate unit 630 may include logic and/or other circuitry, programmable and/or hardwired, for example, to steer sensor content obtained from particular sensor nodes 400 to particular buffers of a particular sensor content archive, such as archive 610, for example. As discussed more fully below, responsive to particular conditions related to incoming sensor content and/or other conditions internal to gateway device 600, rotate unit 630 may redirect sensor content to different buffers of a different sensor content archive, such as archive 620, for example. Further, in a particular implementation, as sensor content is being directed to a first sensor content archive, such as archive 610, Huffman encoding unit 640 may operate on sensor content retrieved from a second sensor content archive, such as archive 620, for example. For example, responsive to a rotate condition being met, incoming sensor content may be steered towards and/or stored in archive 610. A Huffman tree may be generated based at least in part on contents of archive 620, and/or various buffers of archive 620 may be re-encoded based at least in part on the generated Huffman tree. An archive header may be generated and/or added to the Huffman tree, and the newly encoded content may be communicated over connection 155 to network 150, for example. In particular implementations, Huffman-type coding operations may periodically switch back and forth between and/or among multiple sensor content archives responsive to further rotate conditions being met. Gateway device 600 may further assemble signal packets at a write header and pack unit, such as unit 650, for subsequent communication via network send unit 660 and/or connection 155, in a particular implementation. Although gateway device 600 is described herein as performing Huffman-type encoding, claimed subject matter is not limited in scope in these respects, as other suitable encoding techniques may be utilized in other implementations. In an embodiment, Huffman encoding unit 640 and/or write header and pack unit 6\560 may comprise one or more processors, including, for example, one or more controllers, microprocessors, microcontrollers, application specific integrated circuits, digital signal processors, programmable logic devices, field programmable gate arrays, the like, or any combination thereof. Further, Huffman-type encoding and/or write header and pack operations may be implemented, at least in part, in software, firmware, and/or hardware, or any combination thereof. Additionally, network send unit 660 may comprise a transceiver and/or other suitable circuitry capable of communication substantially compliant with and/or compatible with any of a wide range of communication protocols and/or network access technologies described herein, for example. Example communications protocols and/or network access technologies are mentioned below.

Figure 7:
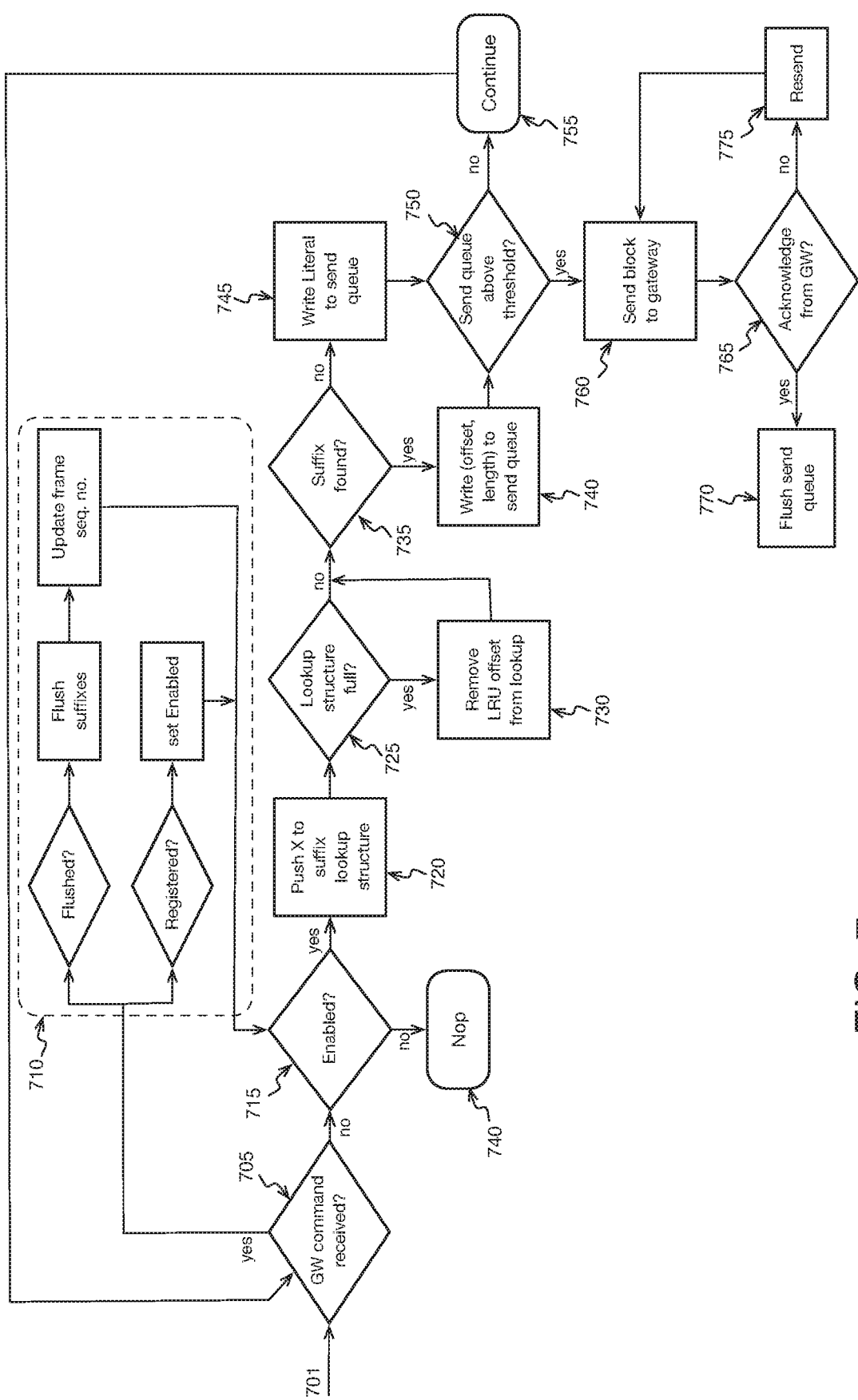
FIG. 7 is an illustration of an example flow diagram depicting an embodiment of a process for encoding content at an example sensor node.

FIG. 7 is an illustration of an example flow diagram depicting an embodiment 700 of a process for encoding content at an example sensor node. Embodiments in accordance with claimed subject matter may include all of blocks 705-775, fewer than blocks 705-775, or greater than blocks 705-775. Also, the order of blocks 705-775 is merely an example, and claimed subject matter is not limited in scope in these respects. It should be noted that content acquired or produced, such as, for example, input signals, output signals, operations, results, etc. associated with example process 700 may be represented via one or more digital signals. It should also be appreciated that even though one or more operations are illustrated or described concurrently or with respect to a certain sequence, other sequences or concurrent operations may be employed. In addition, although the description below references particular aspects and/or features illustrated in certain other figures, one or more operations may be performed with other aspects and/or features.

In a particular implementation, example process 700 may be performed in whole and/or in part by a processor, such as processor 500, of a computing device, such as sensor node 400. In a particular implementation, some and/or all encoding operations may be performed by LZ encode unit 510 which, as mentioned, may comprise one or more programmable execution units that may execute software, firmware, and/or hardwired instructions to encode sensor content. Any and/or all functions depicted in connection with embodiment 700 may be implemented, at least in part, in software, firmware, and/or hardware, or any combination thereof. In general, for a particular implementation, example process 700 may relate to encoding of content, such as sensor content represented by signals and/or signals packets obtained from one or more sensors, for example, particularly at an endpoint device such as sensor node 400. In a particular implementation, encoding may be performed substantially in a manner that would allow decoding by a device substantially compliant and/or compatible with LZ77-type decoding, although, as mentioned, claimed subject matter is not limited in scope to this particular encoding/decoding technique. In a particular implementation, example process 700 may be performed by sensor node 400 in anticipation of further encoding by gateway device 600 as part of an overall process to provide sensor content to a network device via network 150, for example.

Sensor node 400, in a particular implementation, may obtain signals and/or signal packets from one or more sensors 440, one or more external sensors, and/or from gateway device 600, for example. As indicated at FIG. 4, signals and/or signal packets representative of sensor content 445 may be obtained at sensor node 400 from one or more sensors, and/or signals and/or signal packets representative of content (e.g., handshake messages, etc.) from gateway device 600 may be obtained at sensor node 400 via input/output unit 430, for example. As depicted in FIG. 7, incoming signals and/or signal packets representative of sensor content are labeled 701. In general, signals and/or signal packets 701 may be encoded in accordance with example process 700 and/or may be transmitted to gateway device 600, as described in more detail below.

In a particular implementation, a determination may be made, as depicted at block 705, as to whether a command message has been received from gateway device 600. Responsive to receipt of a gateway command message, example process 700 may proceed to operations 710, for example. At block 710, a determination may be made as to whether a gateway command message includes an acknowledgement from gateway device 600 that sensor node 400 has been registered by gateway device 600, for example. In a particular implementation, at least in part in response to an acknowledgement from gateway device 600 that sensor node 400 has been registered by gateway device 600, sensor node 400 may become enabled with respect to sensor content encoding operations. For example, as explained more fully below, to register a particular sensor node, gateway device 600 may assign a particular identifier, such as a device_id parameter, to the particular sensor node. Gateway device 600 may exchange handshake communications with sensor node 400 to indicate assignment of the particular device_id, for example.

Further, in a particular implementation, a "flush" command message may be received at sensor node 400 from gateway device 600, as also indicated at block 710. In a particular implementation, a flush command message may comprise an incremented frame_id delivered in an acknowledgement message, for example. In a particular implementation, a flush command may instruct sensor node 400 to flush (e.g., empty) a suffix lookup structure, such as suffix tree 422 and/or LRU cache 424 of suffix lookup structure 426, for example. Additionally, a flush command may instruct sensor node 400 to update a frame identifier parameter (e.g., frame_id). At least in part by flushing suffix lookup structure 426 and/or by updating a frame identifier parameter, for example, sensor node 400 may begin to assemble a new frame of encoded sensor content for transmission to gateway device 600. Subsequent new frames may be initiated responsive to subsequent flush commands from gateway device 600. In a particular implementation, at least in part due to particular sensor nodes 400 obtaining unique device identifier parameters from gateway device 600 and/or at least in part due to particular block and/or frame identifier parameters being assigned to particular blocks and/or frames of encoded content, gateway device 600 may track and/or appropriately handle content obtained by various sensor nodes 400 (e.g., regardless of the order in which content is obtained from various sensor nodes).

As previously mentioned, gateway device 600 may handle multiple concurrent sets and/or streams of encoded sensor content obtained from one or more sensor nodes 400. In particular implementations, sensor nodes 400 and/or gateway device 600, for example, may independently and/or concurrently update respective replicated content storage structures (buffers, memories, etc.) so as to implement, for example, conflict-free replicated content types. "Conflict-free replicated content types" refers to content structures which may be replicated across multiple computing devices, wherein respective replicas (e.g., replicated content structures stored and/or processed at respective devices, such as sensor nodes 400 and/or gateway device 600) may be updated independently and/or concurrently without coordination between replicas, wherein it is mathematically possible for a device, such as gateway device 600, to independently resolve inconsistencies (e.g., out-of-order receipt and/or processing of one or more blocks and/or frames of sensor content) that may occur. Thus, in particular implementations, gateway device 600, for example, may obtain various blocks and/or frames of sensor content in any order from one or more sensor nodes 400 and/or may further encode sensor content obtained from sensor nodes 400 such that other devices, such as network devices, may decode and/or decompress sensor content correctly. For example, gateway device 600 may reconstruct a suffix lookup structure and/or may decode content obtained from one or more sensor nodes 400 without obtaining a suffix lookup structure from the one or more sensor nodes 400. That is, in a particular implementation, although a suffix lookup structure may not be communicated between one or more sensor nodes 400 and gateway device 600, gateway device 600 may reconstruct a suffix lookup structure from encoded content obtained from one or more sensor nodes 400. Example identifiers (e.g., device_id, frame_id, block_id) and/or techniques that may be utilized to implement conflict-free replicated content types are discussed more fully below.

As indicated at block 715, a determination may be made as to whether sensor node 400 is enabled for encoding operations. As mentioned above, encoding operations may become enabled responsive to an acknowledgement by gateway device 600 that sensor node 400 has been registered (e.g., assigned unique device_id). As indicated at block 740, for a particular implementation, until and/or unless an acknowledgement of sensor node registration is obtained from gateway device 600, no encoding operations may be performed, at least in part because gateway device 600 would not be prepared to receive the encoded content, for example. However, as depicted at block 715, responsive to enablement of coding operations, example process 700 may proceed to block 720, in a particular implementation.

As indicated at block 720, for a particular implementation, a current segment "X" of incoming sensor content 701 (e.g., one or more symbols) may be stored in suffix lookup structure 426, including suffix tree 422 and/or LRU cache 424, for example. Further, for a particular implementation, a determination may be made as to whether suffix lookup structure 426 is full (e.g., specified threshold met and/or exceeded), as indicated at block 725. At least in part in response to a determination that suffix lookup structure 426 is full, a least-recently offset parameter may be removed from suffix lookup structure 426, as indicated at block 730, in a particular implementation. Alternatively, for example, a size for suffix lookup structure 426 may be altered at least in part in response to an indication of a full suffix lookup structure. In a particular implementation, window size W may also be altered, for example.

Figure 8:
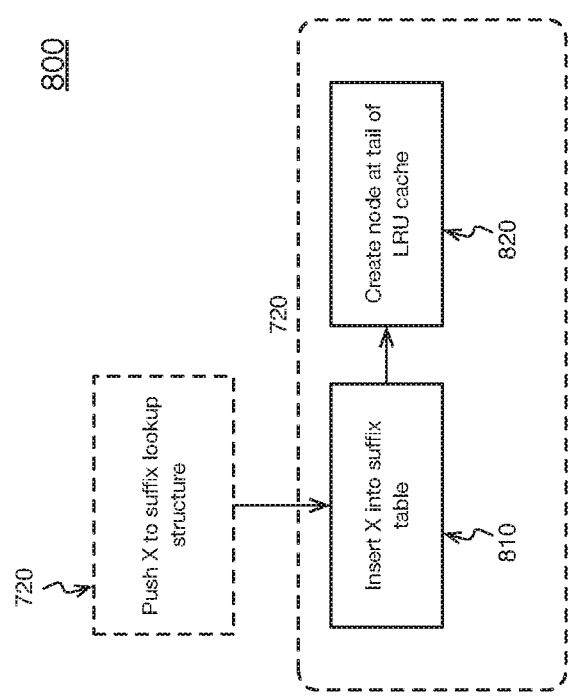
FIG. 8 is an illustration of an example flow diagram depicting an embodiment of a process for encoding content at an example sensor node.

FIG. 8 depicts an embodiment 800 of an example process to push a segment of incoming sensor content to a suffix lookup structure, such as mentioned above in connection with block 720. As mentioned previously, a suffix lookup structure may comprise a suffix array, a suffix tree, a hash table, and/or the like, to name a few non-limiting examples. For a particular implementation, segment X may be inserted into suffix table 422, for example, as indicated at block 810. Further, in a particular implementation, a node may be created at a tail of LRU cache 424, as indicated at block 820. Embodiments in accordance with claimed subject matter may include all of blocks 810-820, fewer than blocks 810-820, or greater than blocks 810-820. Also, the order of blocks 810-820 is merely an example, and claimed subject matter is not limited in scope in these respects.

Figure 9:
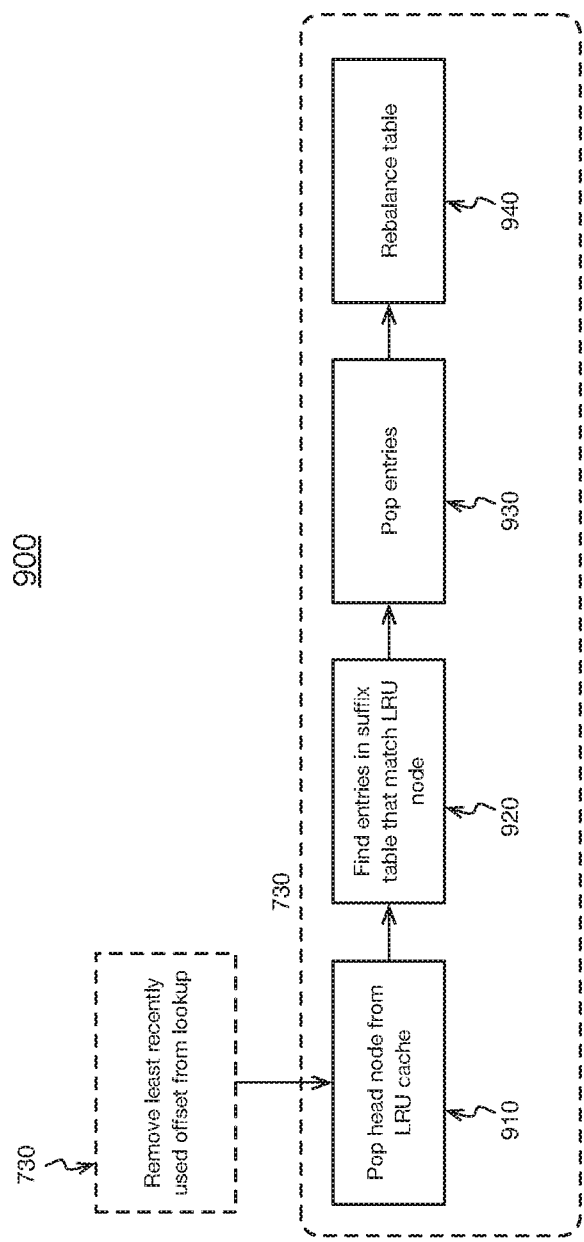
FIG. 9 is an illustration of an example flow diagram depicting an embodiment of a process for encoding content at an example sensor node.

FIG. 9 depicts an embodiment 900 of an example process to remove a least-recently used offset from suffix lookup structure 426, for example. In a particular implementation, a node from a head of LRU cache 424 may be popped (e.g., removed) from LRU cache 424, as indicated at block 910. "Popped" refers to removing a head of a linked list content structure, for example. In a particular implementation, LRU cache 424 and/or suffix tree 422 may be implemented, at least in part, as linked-list type structures, although claimed subject matter is not limited in scope in these respects. In a particular implementations, to "pop" a head of LRU cache 424 refers to removing a least-recently used and/or oldest entry. As indicated at block 920, one or more entries from suffix table 422 may be identified that match the node popped from the head of LRU cache 424, in a particular implementation. In particular implementations, identified entries may be popped (e.g., removed) from suffix tree 422, as indicated at block 930, for example, and/or suffix tree 422 may be rebalanced, for example, as further depicted at block 940. In a particular implementation, for suffix tree 422, for example, a rebalancing may include reconnecting various nodes of the tree to account for the newly-missing nodes so as to maintain integrity of the tree structure. Embodiments in accordance with claimed subject matter may include all of blocks 910-940, fewer than blocks 910-940, or greater than blocks 910-940. Also, the order of blocks 910-940 is merely an example, and claimed subject matter is not limited in scope in these respects.

Returning again to FIG. 7, in addition to adding current content segment X to a suffix lookup structure, a search may be performed to find a match for current content segment X, as depicted, for example, at block 735. In a particular implementation, an offset, length pair of parameters may be returned as part of a suffix lookup structure search operation.

Further, as indicated at block 740, an offset, length pair of parameters may be added to a send queue, such as send buffer 530. Additionally, in a particular implementation, a literal may be added to send buffer 530 at least in part in response to a search of a suffix lookup structure not yielding a match for segment X.

As depicted at block 750, for example, a determination may be made as to whether send buffer 530 may be filled at and/or beyond a specified threshold level. As further depicted at block 755, at least in part in response to send buffer 530 not yet being filled to at least a threshold level, encoding processing of incoming sensor content may continue, wherein additional segments of incoming sensor content may be encoded and/or additional literals and/or offset, length pairs of parameters may be added to send buffer 530, for example. As previously mentioned, a periodic determination may be made as to whether a gateway device command message may have been received, as indicated at block 705, in a particular implementation.

As additionally depicted at block 750 and/or at block 760, a block of encoded content may be transmitted from send buffer 530 to gateway device 600, for example. In a particular implementation, input/output unit 430 may obtain signals and/or signal packets from send buffer 530 and/or may transmit one or more signal packets via connection 120 to gateway device 600, for example. In a particular implementation, encoded output content may be transmitted on a block-by-block basis, with individual blocks containing a plurality of signal packets representative of a segment of encoded output content. Individual blocks may be assigned particular block identifiers (e.g., block_id), for example. Thus, encoded sensor content may be identified according to device_id and/or frame_id, wherein a frame may comprise multiple blocks. In a particular implementation, a block size may be substantially similar to a size of a send queue, such as may be implemented, at least in part, in send buffer 530, for example. Additionally, in a particular implementation, frame size may be variable. For example, a new frame may be specified at least in part in response to a flush of suffix lookup structure 426, in a particular implementation. As mentioned previously, a flush of suffix lookup structure 426 may occur at least in part in response to a flush command obtained from gateway device 600, for example.

In a particular implementation, at least in part in response to sending a block of encoded sensor content to gateway device 600, a determination may be made as to whether an acknowledgement message has been received from gateway device 600, as indicated at block 765, for example. In a particular implementation, if no acknowledgement has been obtained after a specified period of time has elapsed, sensor node 400 may resend the block, as indicated, for example, at block 775. Further, in a particular implementation, at least in part in response to an acknowledgement received from gateway device 600, sensor node 400 may flush send buffer 530.

Figure 10:
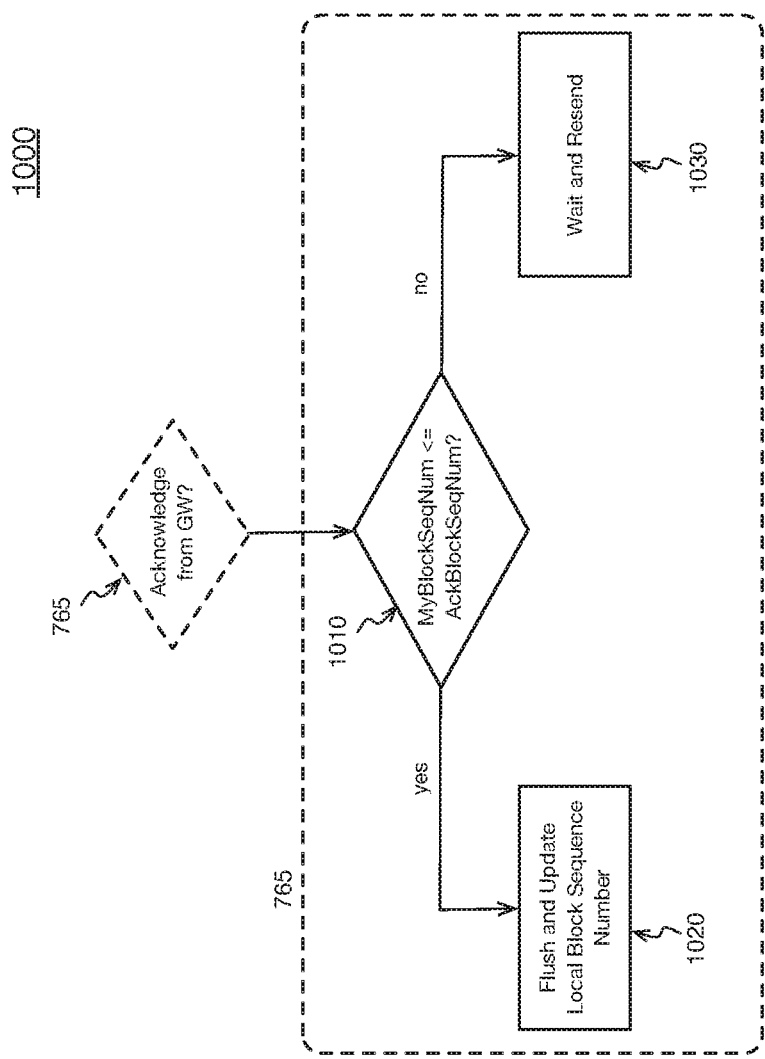
FIG. 10 is an illustration of an example flow diagram depicting an embodiment of a process for encoding content at an example sensor node.

FIG. 10 depicts an embodiment 1000 of an example process to track acknowledgment from gateway device 600. In a particular implementation, an acknowledgment message from a gateway device, such as gateway device 600, may return a block_id parameter. As indicated at block 1010, at least in part in response to obtaining an acknowledgement message from gateway device 600, a determination may be made as to whether a block_id value identified in an acknowledgement message (e.g., AckBlockSeqNum) exceeds a block_id value for a current block for sensor node 400 (e.g., MyBlockSeqNum). In a particular implementation, a block_id value identified in an acknowledgement message exceeding a block_id value for a current block for sensor node 400 may indicate that gateway device 600 successfully obtained the current block and/or has as a result incremented a block_id parameter at gateway device 600. At least in part in response to a block_id value identified in an acknowledgement message exceeding a block_id value for a current block, send buffer 530 may be flushed and a local block sequence number may be updated, as indicated at block 1020, for example. As further indicated at block 1030, sensor node 400 may wait and/or may resend a particular block at least in part in response to a block_id value identified in an acknowledgement message being less than and/or equal to a block_id value for a current block, which may indicate that gateway device 600 has not yet indicated a successful receipt of the current block, for example. In this manner, for a particular implementation, sensor node 400 may maintain a current block in a send buffer and/or may periodically resend a current block to gateway device 600 until gateway device 600 indicates (e.g., via incremented block_id) that the current block has been successfully received and/or stored at gateway device 600. Further, the example block_id handshake described above may help ensure implementation of conflict-free replicated content types involving, for example, sensor nodes 400 and/or gateway device 600. Embodiments in accordance with claimed subject matter may include all of blocks 1010-1030, fewer than blocks 1010-1030, or greater than blocks 1010-1030. Also, the order of blocks 1010-1030 is merely an example, and claimed subject matter is not limited in scope in these respects.

Figure 11:
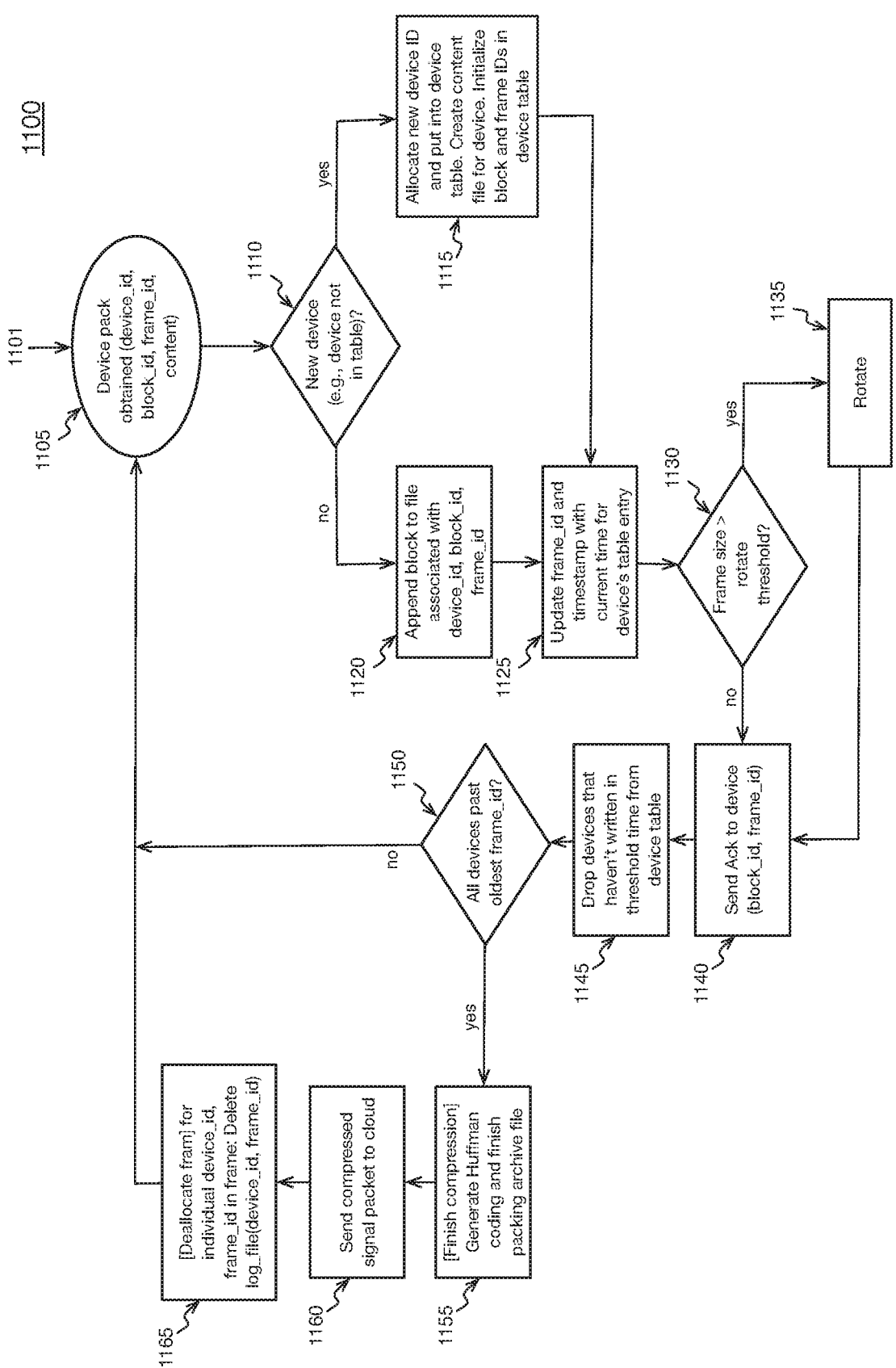
FIG. 11 is an illustration of an example flow diagram depicting an embodiment of a process for encoding content at an example gateway device.

FIG. 11 is an illustration of an embodiment 1100 of an example process for encoding content at example gateway device 600, including content obtained from one or more sensor nodes 400. In general, for a particular implementation, gateway device 600 may perform Huffman-type encoding on content (e.g., sensor content) obtained from one or more sensor nodes 400 and/or may transmit encoded sensor content obtained from sensor nodes 400 to one or more network devices via connection 155 of network 150, for example. Embodiments in accordance with claimed subject matter may include all of blocks 1105-1165, fewer than blocks 1105-1165, or greater than blocks 1105-1165. Also, the order of blocks 1105-1165 is merely an example, and claimed subject matter is not limited in scope in these respects. As depicted in FIG. 11, signals and/or signal packets representative of a particular block of sensor content 1101 may be obtained from a particular sensor node 400. As mentioned, gateway device 600 may obtain multiple sets of content from multiple sensor nodes. For the particular example depicted in FIG. 11, gateway device 600 may obtain sensor content 1101 from a particular sensor node 400.

As indicated at block 1105, a block of sensor content obtained from a particular sensor node 400 may be identified according to device_id, block_id and/or frame_id. As indicated at block 1110, for example, a determination may be made as to whether gateway device 600 recognizes a device_id of incoming sensor content as a device that has previously been recognized and/or registered with gateway device 600 or whether device_id indicates a new device (e.g., a sensor node 400 not previously recognized by gateway device 600). For example, gateway device 600 may perform a lookup into a device table to determine whether a particular device_id has been previously allocated. At least in part in response to a determination that a device_id for incoming sensor content indicates a new device, the device_id may be allocated to a device table stored in a memory of gateway device 600, for example. Additionally, in a particular implementation, gateway device 600 may further define and/or otherwise create a buffer file to store content obtained from new sensor node 400 and/or may also initialize block and/or frame identifiers (e.g., block_id, frame_id) in a device table. As indicated at block 1120, for example, at least in part in response to a determination that a device_id for incoming sensor content does not indicate a new device, gateway device 600 may append sensor content block 1101 to a previously-allocated buffer associated with a specified device_id, block_id, and/or frame_id within a current archive (e.g., archive 610 and/or archive 620), in a particular implementation. Further, in a particular implementation, as indicated at block 1125, responsive to sensor content block 1101 being appended to a particular storage buffer, as indicated, for example, at block 1120, a frame_id may be updated. Further, a timestamp maintained in a device table entry associated with the particular sensor node 400 may be updated with a current time, for example.

Figure 12:
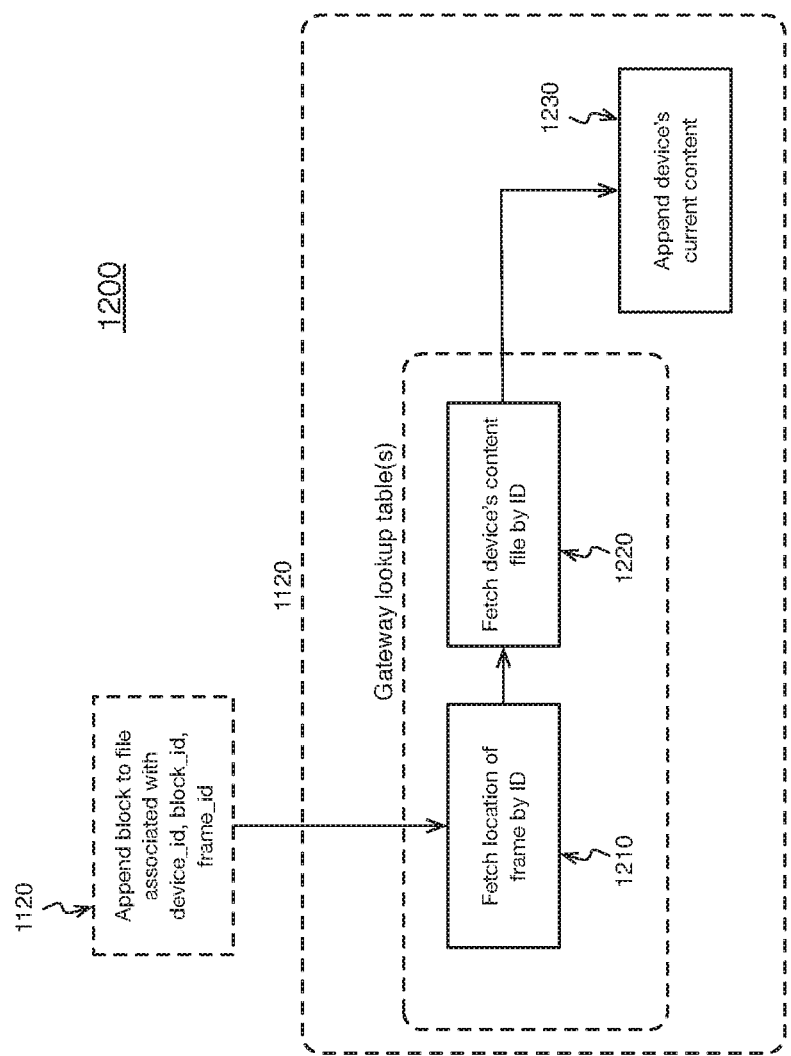
FIG. 12 is an illustration of an example flow diagram depicting an embodiment of a process for encoding content at an example gateway device.

FIG. 12 is an illustration of an embodiment 1200 of an example process for encoding content at example gateway device 600, including appending a block of sensor content obtained from particular sensor node 400 in a particular storage buffer at gateway device 600, at least in part in accordance with an operation depicted at block 1120 of FIG. 11. Embodiments in accordance with claimed subject matter may include all of blocks 1210-1230, fewer than blocks 1210-1230, or greater than blocks 1210-1230. Also, the order of blocks 1210-1230 is merely an example, and claimed subject matter is not limited in scope in these respects. In a particular implementation, gateway device 600 may include one or more lookup tables. Further, in a particular implementation, to store a particular block of sensor content in a particular storage buffer, a lookup may be performed into a lookup table to determine a particular lookup table associated with a particular frame_id, as indicated at block 1210. As additionally indicated at block 1220, for example, a location for storage file associated with a particular sensor node 400 may be identified based at least in part on device_id at least in part by performing a lookup into particular table identified at block 1210, in a particular implementation. Further, in a particular implementation, based at least in part on file location indicator determined at block 1220, for example, current sensor content block 1101 may be stored in an appropriate buffer within a current archive (e.g., archive 610 and/or archive 620).

Returning again to FIG. 11, in a particular implementation, a determination may be made as to whether a frame size has exceeded a specified rotate threshold, as indicated at block 1130. At least in part in response to a current frame size not exceeding a rotate threshold, an acknowledgment message may be transmitted by gateway device 600 to particular sensor node 400 to indicate successful receipt of sensor content block 1101, for a particular implementation. Also, in a particular implementation, at least in part in response to a current frame size exceeding a specified rotate threshold, a rotate operation may be performed as indicated at block 1135.

Figure 13:
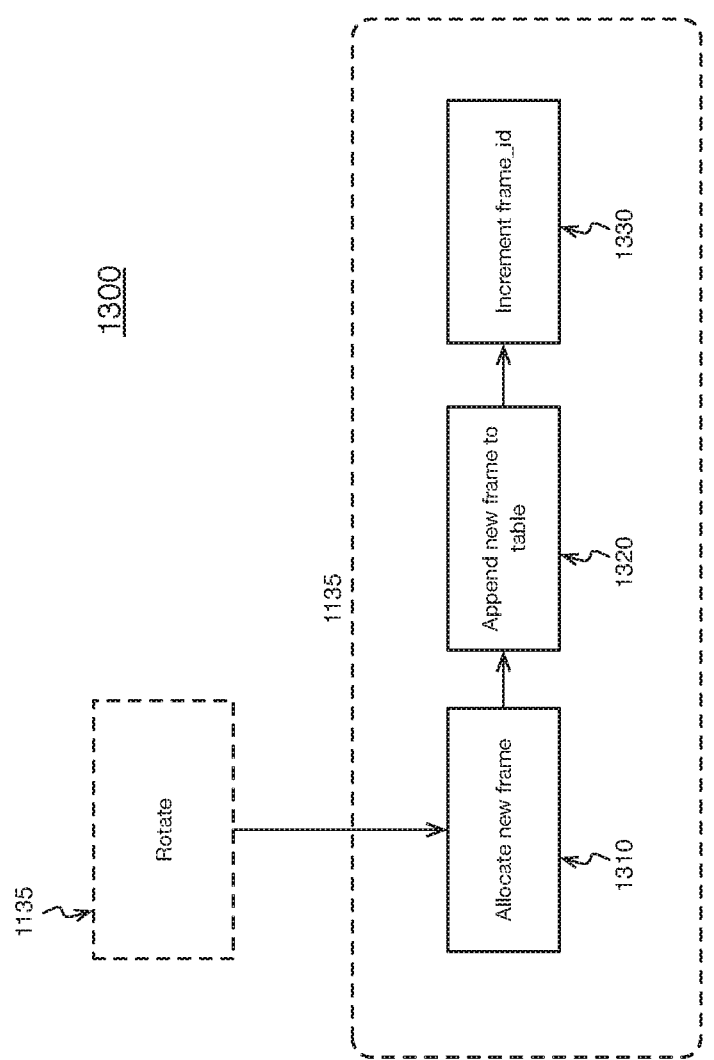
FIG. 13 is an illustration of an example flow diagram depicting an embodiment of a process for encoding content at an example gateway device.

FIG. 13 is an illustration of an embodiment 1300 of an example process for performing a rotate operation at example gateway device 600. Embodiments in accordance with claimed subject matter may include all of blocks 1310-1330, fewer than blocks 1310-1330, or greater than blocks 1310-1330. Also, the order of blocks 1310-1330 is merely an example, and claimed subject matter is not limited in scope in these respects. In a particular implementation, a rotate operation may include allocating a new frame, as indicated at block 1310. Additionally, for example, an identifier for a newly allocated frame may be appended to a lookup table, as indicated at block 1320. Further, as indicated at block 1330, a frame_id may be incremented. By incrementing frame_id, sensor node 400 may in response flush its suffix lookup structure, may increment its own frame_id, and/or may begin encoding content for a newly allocated frame. See, for example, block 710 of FIG. 7, discussed above.

Returning again to FIG. 11, in a particular implementation, an acknowledge message may be communicated between gateway device 600 and particular sensor node 400, as indicated at block 1140. In a particular implementation, an acknowledge message may include a device_id and/or may also include a frame_id. As mentioned, at least in part responsive to frame_id being incremented, sensor node 400 may flush its suffix lookup structure, as described above. Additionally, in a particular implementation, one or more sensor nodes 400 that may have not provided content to gateway 600 for at least a threshold period of time may be dropped by gateway device 600, as indicated at block 1145. For example, one or more sensor nodes 400 may have their device_id removed from one or more device_id tables. Further, content previously stored in one or more archives may be deleted and/or reallocated, for example.

As depicted at block 1150, in a particular implementation, a determination may be made as to whether all active sensor nodes 400 are using frame_id values that are more recent than an oldest frame_id value. At least in part in response to one or more sensor nodes 400 continuing to write to an oldest frame_id, operation may continue whereby gateway device 600 may continue to obtain sensor content, such as indicated at block 1105, for example. However, at least in part responsive to all active sensor nodes 400 writing to frames with frame_id more recent than an oldest frame_id, gateway device 600 may perform Huffman-type encoding and/or may pack a current archive to complete an encoding process, as indicated at block 1155, for example. In a particular implementation, Huffman encoding unit 640 and/or write header and pack unit 650 may be employed. Further, as indicated at block 1160, signals and/or signal packets representative of Huffman-encoded content may be retrieved from a current archive (e.g., archive 610 and/or archive 620) and/or may be transmitted to one or more network devices via network send unit 660, for example. Additionally, for a particular implementation, at least in part in response to transmission of signals and/or signal packet representative of encoded content, such as depicted in block 1160, for particular device_id, frame_id of a particular frame, associated lookup tables and/or log files pertaining to the particular frame may be deleted, as indicated at block 1165. Gateway device 600 may, at least in part in response to deallocation of a particular frame, continue to obtain sensor content from one or more sensor nodes 400, as again indicated at block 1105.

Figure 14:
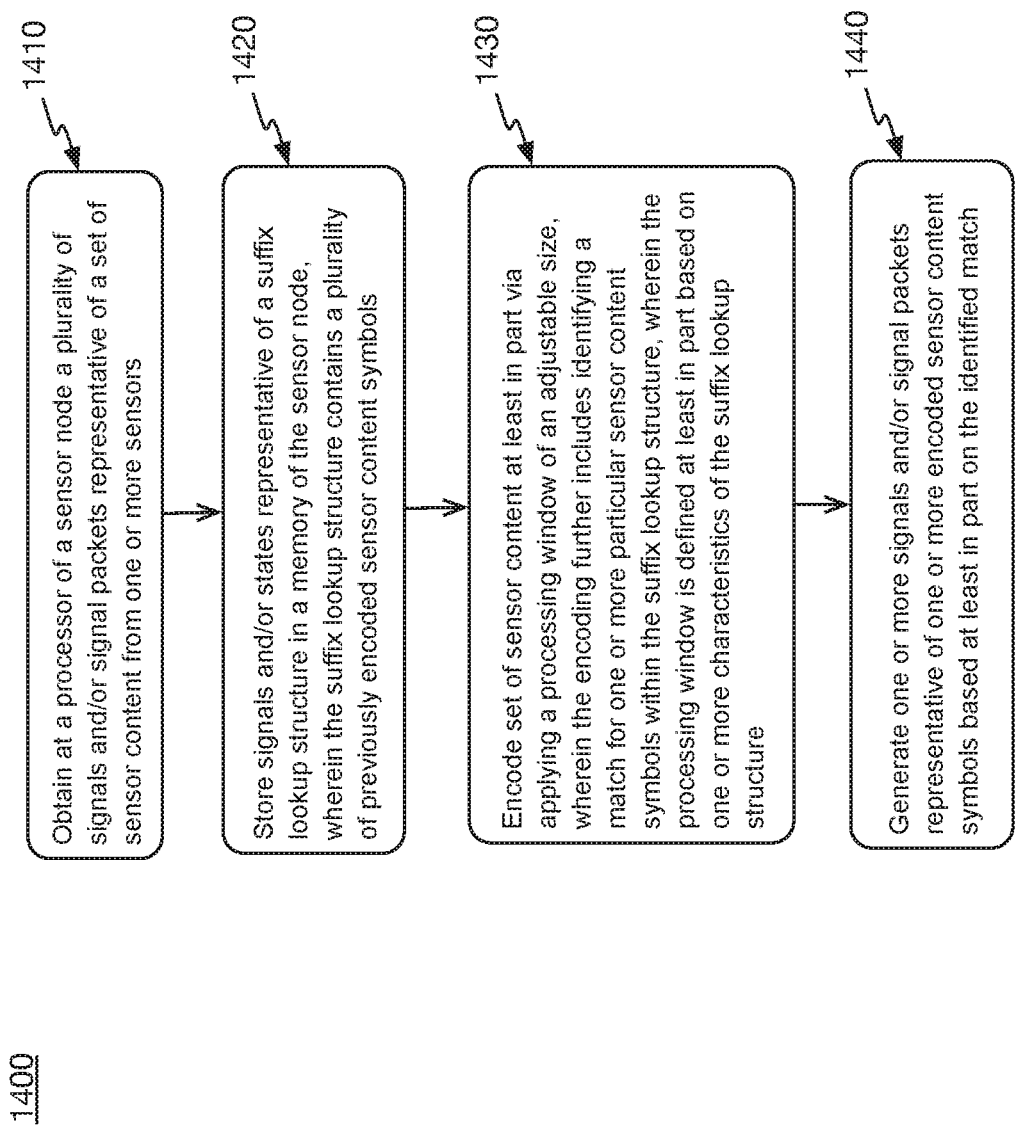
FIG. 14 is an illustration of an example flow diagram depicting an embodiment of a process for distributed encoding of content at an example sensor node.

FIG. 14 is an illustration of an example simplified flow diagram depicting an embodiment 1400 of an example process for encoding of content at an example sensor node. Embodiments in accordance with claimed subject matter may include all of blocks 1410-1440, fewer than blocks 1410-1440, or greater than blocks 1410-1440. Also, the order of blocks 1410-1440 is merely an example, and claimed subject matter is not limited in scope in these respects. In a particular implementation, a processor, such as processor 500, at a sensor node, such as sensor node 400, may obtain a plurality of signals and/or signal packets representative of a set of sensor content symbols from one or more sensors, as indicated at block 1410. Further, as indicated at block 1420, sensor node 400 may store signals and/or states representative of a suffix lookup structure in a memory of a sensor node, wherein a suffix lookup structure may contain a plurality of previously encoded sensor content symbols, for example. In a particular implementation, processor 500 of sensor node 400, for example, may encode a set of sensor content symbols at least in part by applying a processing window of an adjustable size, as indicated at block 1430. As also indicated at block 1430, encoding a set of sensor content symbols may further include identifying a match for one or more particular sensor content symbols within a suffix lookup structure, wherein a processing window may defined at least in part based on one or more characteristics of a suffix lookup structure, in a particular implementation. Additionally, as indicated at block 1440, sensor node 400 may generate signals and/or signal packets representative of one or more encoded sensor content symbols based at least in part on an identified match.

Further, in a particular implementation, a suffix lookup structure may comprise a least-recently used cache structure. Additionally, a processor may further store an identified match for one or more particular sensor content symbols in a least-recently used cache structure.

In a particular implementation, a processing window may comprise a slidable processing window that may be implemented, at least in part, to allow decoding by a process compliant with and/or compatible with an LZ77-type protocol. Further, in a particular implementation, a slidable processing window may be defined with respect to size based at least in part on a size of a suffix lookup structure. For example, a processor may redefine a size of a suffix lookup structure and may redefine a slidable processing window with respect to size responsive to and/or in accordance with the redefined size of the suffix lookup structure.

In a particular implementation, an apparatus, such as a sensor node, may comprise a transceiver circuit to transmit one or more signals and/or signal packets representative of one or more encoded content symbols to a gateway device via a wireless connection compatible with and/or compliant with a low power long range wide area network protocol.

Example embodiments may include particular implementations comprising, for example: obtaining at a processor of a sensor node a plurality of signals and/or signal packets representative of a set of sensor content symbols from one or more sensors; storing signals and/or states representative of a suffix lookup structure in a memory of a sensor node, wherein a suffix lookup structure may contain a plurality of previously encoded sensor content symbols; encoding, utilizing at least in part a processor, a set of sensor content symbols at least in part by applying a processing window of an adjustable size, wherein encoding may further include identifying a match for one or more particular sensor content symbols within a suffix lookup structure, wherein a processing window may be defined at least in part based on one or more characteristics of a suffix lookup structure; and generating, utilizing at least in part a processor, one or more signals and/or signal packets representative of one or more encoded sensor content symbols based at least in part on an identified match.

In a particular implementation, a suffix lookup structure may comprise a least-recently used cache structure. Further, a particular implementation may further include storing an identified match for one or more particular sensor content symbols in a least-recently used cache structure.

In a particular implementation, a processing window may comprise a slidable processing window that may be implemented, at least in part, to allow decoding by a process compliant with and/or compatible with an LZ77-type protocol. A particular implementation may also include defining a slidable processing window with respect to size based at least in part on a size of a suffix lookup structure. Additionally, a particular implementation may include redefining a size of a suffix lookup structure and/or redefining a slidable processing window with respect to size responsive to and/or in accordance with a redefined size of a suffix lookup structure.

A particular implementation may further comprise transmitting one or more signals and/or signal packets representative of one or more encoded content symbols to a gateway device via a wireless connection compatible with and/or compliant with a low power long range wide area network protocol.

Example embodiments may include particular implementations in which as system may comprise: one or more sensor nodes to individually include at least one processor to obtain a plurality of signals and/or signal packets representative of a set of sensor content symbols from one or more sensors and a memory coupled to at least one processor to store a suffix lookup structure to contain a plurality of previously encoded sensor content symbols, wherein at least one processor to encode a set of sensor content symbols at least in part via application of a slidable processing window of an adjustable size, wherein a slidable processing window to be defined at least in part based on one or more characteristics of a suffix lookup structure; and a gateway device to obtain an encoded set of sensor content symbols from one or more sensor nodes via a wireless connection, wherein a gateway device to further encode an encoded set of sensor content symbols and to transmit one or more signals and/or signal packets representative of a further encoded set of sensor content symbols to a network device over a network.

In a particular implementation, one or more processors of the one or more sensor nodes to encode a set of sensor content symbols to allow decoding by a process compliant with and/or compatible with an LZ77-type protocol. Further, in a particular implementation, a gateway device may further encode a set of sensor content symbols to allow decoding by a process in substantial compliance with and/or compatible with a Huffman-type encoding protocol.

In a particular implementation, a slidable processing window may be defined with respect to size based at least in part on a size of a suffix lookup structure. One or more processors of one or more sensor nodes may redefine a size of the suffix lookup structure and/or may redefine a slidable processing window with respect to size responsive to and in accordance with a redefined size of the suffix lookup structure.

In a particular implementation, a gateway device may further include a content storage structure to store an encoded set of sensor content symbols obtained from one or more sensor nodes, wherein a suffix lookup structure of one or more sensor nodes and/or a content storage structure of a gateway device comprise conflict-free replicated content types. In a particular implementation, one or more sensor nodes and/or a gateway device may independently and/or concurrently maintain consistency of a suffix lookup structure and/or a content storage structure, respectively. For example, a gateway device may reconstruct a suffix lookup structure and/or may decode content obtained from a sensor node without obtaining a suffix lookup structure from the sensor node. That is, in a particular implementation, although a suffix lookup structure may not be communicated between a sensor node and a gateway device, the gateway device may reconstruct a suffix lookup structure from encoded content obtained from the sensor node.

In the context of the present patent application, the term "connection," the term "component" and/or similar terms are intended to be physical, but are not necessarily always tangible. Whether or not these terms refer to tangible subject matter, thus, may vary in a particular context of usage. As an example, a tangible connection and/or tangible connection path may be made, such as by a tangible, electrical connection, such as an electrically conductive path comprising metal or other conductor, that is able to conduct electrical current between two tangible components. Likewise, a tangible connection path may be at least partially affected and/or controlled, such that, as is typical, a tangible connection path may be open or closed, at times resulting from influence of one or more externally derived signals, such as external currents and/or voltages, such as for an electrical switch. Non-limiting illustrations of an electrical switch include a transistor, a diode, etc. However, a "connection" and/or "component," in a particular context of usage, likewise, although physical, can also be non-tangible, such as a connection between a client and a server over a network, particularly a wireless network, which generally refers to the ability for the client and server to transmit, receive, and/or exchange communications, as discussed in more detail later.

In a particular context of usage, such as a particular context in which tangible components are being discussed, therefore, the terms "coupled" and "connected" are used in a manner so that the terms are not synonymous. Similar terms may also be used in a manner in which a similar intention is exhibited. Thus, "connected" is used to indicate that two or more tangible components and/or the like, for example, are tangibly in direct physical contact. Thus, using the previous example, two tangible components that are electrically connected are physically connected via a tangible electrical connection, as previously discussed. However, "coupled," is used to mean that potentially two or more tangible components are tangibly in direct physical contact. Nonetheless, "coupled" is also used to mean that two or more tangible components and/or the like are not necessarily tangibly in direct physical contact, but are able to co-operate, liaise, and/or interact, such as, for example, by being "optically coupled." Likewise, the term "coupled" is also understood to mean indirectly connected. It is further noted, in the context of the present patent application, since memory, such as a memory component and/or memory states, is intended to be non-transitory, the term physical, at least if used in relation to memory necessarily implies that such memory components and/or memory states, continuing with the example, are tangible.

Additionally, in the present patent application, in a particular context of usage, such as a situation in which tangible components (and/or similarly, tangible materials) are being discussed, a distinction exists between being "on" and being "over." As an example, deposition of a substance "on" a substrate refers to a deposition involving direct physical and tangible contact without an intermediary, such as an intermediary substance, between the substance deposited and the substrate in this latter example; nonetheless, deposition "over" a substrate, while understood to potentially include deposition "on" a substrate (since being "on" may also accurately be described as being "over"), is understood to include a situation in which one or more intermediaries, such as one or more intermediary substances, are present between the substance deposited and the substrate so that the substance deposited is not necessarily in direct physical and tangible contact with the substrate.

A similar distinction is made in an appropriate particular context of usage, such as in which tangible materials and/or tangible components are discussed, between being "beneath" and being "under." While "beneath," in such a particular context of usage, is intended to necessarily imply physical and tangible contact (similar to "on," as just described), "under" potentially includes a situation in which there is direct physical and tangible contact, but does not necessarily imply direct physical and tangible contact, such as if one or more intermediaries, such as one or more intermediary substances, are present. Thus, "on" is understood to mean "immediately over" and "beneath" is understood to mean "immediately under."

It is likewise appreciated that terms such as "over" and "under" are understood in a similar manner as the terms "up," "down," "top," "bottom," and so on, previously mentioned. These terms may be used to facilitate discussion, but are not intended to necessarily restrict scope of claimed subject matter. For example, the term "over," as an example, is not meant to suggest that claim scope is limited to only situations in which an embodiment is right side up, such as in comparison with the embodiment being upside down, for example. An example includes a flip chip, as one illustration, in which, for example, orientation at various times (e.g., during fabrication) may not necessarily correspond to orientation of a final product. Thus, if an object, as an example, is within applicable claim scope in a particular orientation, such as upside down, as one example, likewise, it is intended that the latter also be interpreted to be included within applicable claim scope in another orientation, such as right side up, again, as an example, and vice-versa, even if applicable literal claim language has the potential to be interpreted otherwise. Of course, again, as always has been the case in the specification of a patent application, particular context of description and/or usage provides helpful guidance regarding reasonable inferences to be drawn.

Unless otherwise indicated, in the context of the present patent application, the term "or" if used to associate a list, such as A, B, or C, is intended to mean A, B, and C, here used in the inclusive sense, as well as A, B, or C, here used in the exclusive sense. With this understanding, "and" is used in the inclusive sense and intended to mean A, B, and C; whereas "and/or" can be used in an abundance of caution to make clear that all of the foregoing meanings are intended, although such usage is not required. In addition, the term "one or more" and/or similar terms is used to describe any feature, structure, characteristic, and/or the like in the singular, "and/or" is also used to describe a plurality and/or some other combination of features, structures, characteristics, and/or the like. Likewise, the term "based on" and/or similar terms are understood as not necessarily intending to convey an exhaustive list of factors, but to allow for existence of additional factors not necessarily expressly described.

Furthermore, it is intended, for a situation that relates to implementation of claimed subject matter and is subject to testing, measurement, and/or specification regarding degree, that the particular situation be understood in the following manner. As an example, in a given situation, assume a value of a physical property is to be measured. If alternatively reasonable approaches to testing, measurement, and/or specification regarding degree, at least with respect to the property, continuing with the example, is reasonably likely to occur to one of ordinary skill, at least for implementation purposes, claimed subject matter is intended to cover those alternatively reasonable approaches unless otherwise expressly indicated. As an example, if a plot of measurements over a region is produced and implementation of claimed subject matter refers to employing a measurement of slope over the region, but a variety of reasonable and alternative techniques to estimate the slope over that region exist, claimed subject matter is intended to cover those reasonable alternative techniques unless otherwise expressly indicated.

To the extent claimed subject matter is related to one or more particular measurements, such as with regard to physical manifestations capable of being measured physically, such as, without limit, temperature, pressure, voltage, current, electromagnetic radiation, etc., it is believed that claimed subject matter does not fall within the abstract idea judicial exception to statutory subject matter. Rather, it is asserted, that physical measurements are not mental steps and, likewise, are not abstract ideas.

It is noted, nonetheless, that a typical measurement model employed is that one or more measurements may respectively comprise a sum of at least two components. Thus, for a given measurement, for example, one component may comprise a deterministic component, which in an ideal sense, may comprise a physical value (e.g., sought via one or more measurements), often in the form of one or more signals, signal samples and/or states, and one component may comprise a random component, which may have a variety of sources that may be challenging to quantify. At times, for example, lack of measurement precision may affect a given measurement. Thus, for claimed subject matter, a statistical or stochastic model may be used in addition to a deterministic model as an approach to identification and/or prediction regarding one or more measurement values that may relate to claimed subject matter.

For example, a relatively large number of measurements may be collected to better estimate a deterministic component. Likewise, if measurements vary, which may typically occur, it may be that some portion of a variance may be explained as a deterministic component, while some portion of a variance may be explained as a random component. Typically, it is desirable to have stochastic variance associated with measurements be relatively small, if feasible. That is, typically, it may be preferable to be able to account for a reasonable portion of measurement variation in a deterministic manner, rather than a stochastic matter as an aid to identification and/or predictability.

Along these lines, a variety of techniques have come into use so that one or more measurements may be processed to better estimate an underlying deterministic component, as well as to estimate potentially random components. These techniques, of course, may vary with details surrounding a given situation. Typically, however, more complex problems may involve use of more complex techniques. In this regard, as alluded to above, one or more measurements of physical manifestations may be modelled deterministically and/or stochastically. Employing a model permits collected measurements to potentially be identified and/or processed, and/or potentially permits estimation and/or prediction of an underlying deterministic component, for example, with respect to later measurements to be taken. A given estimate may not be a perfect estimate; however, in general, it is expected that on average one or more estimates may better reflect an underlying deterministic component, for example, if random components that may be included in one or more obtained measurements, are considered. Practically speaking, of course, it is desirable to be able to generate, such as through estimation approaches, a physically meaningful model of processes affecting measurements to be taken.

In some situations, however, as indicated, potential influences may be complex. Therefore, seeking to understand appropriate factors to consider may be particularly challenging. In such situations, it is, therefore, not unusual to employ heuristics with respect to generating one or more estimates. Heuristics refers to use of experience related approaches that may reflect realized processes and/or realized results, such as with respect to use of historical measurements, for example. Heuristics, for example, may be employed in situations where more analytical approaches may be overly complex and/or nearly intractable. Thus, regarding claimed subject matter, an innovative feature may include, in an example embodiment, heuristics that may be employed, for example, to estimate and/or predict one or more measurements.

It is further noted that the terms "type" and/or "like," if used, such as with a feature, structure, characteristic, and/or the like, using "optical" or "electrical" as simple examples, means at least partially of and/or relating to the feature, structure, characteristic, and/or the like in such a way that presence of minor variations, even variations that might otherwise not be considered fully consistent with the feature, structure, characteristic, and/or the like, do not in general prevent the feature, structure, characteristic, and/or the like from being of a "type" and/or being "like," (such as being an "optical-type" or being "optical-like," for example) if the minor variations are sufficiently minor so that the feature, structure, characteristic, and/or the like would still be considered to be substantially present with such variations also present. Thus, continuing with this example, the terms optical-type and/or optical-like properties are necessarily intended to include optical properties. Likewise, the terms electrical-type and/or electrical-like properties, as another example, are necessarily intended to include electrical properties. It should be noted that the specification of the present patent application merely provides one or more illustrative examples and claimed subject matter is intended to not be limited to one or more illustrative examples; however, again, as has always been the case with respect to the specification of a patent application, particular context of description and/or usage provides helpful guidance regarding reasonable inferences to be drawn.

With advances in technology, it has become more typical to employ distributed computing and/or communication approaches in which portions of a process, such as signal processing of signal samples, for example, may be allocated among various devices, including one or more client devices and/or one or more server devices, via a computing and/or communications network, for example. A network may comprise two or more devices, such as network devices and/or computing devices, and/or may couple devices, such as network devices and/or computing devices, so that signal communications, such as in the form of signal packets and/or signal frames (e.g., comprising one or more signal samples), for example, may be exchanged, such as between a server device and/or a client device, as well as other types of devices, including between wired and/or wireless devices coupled via a wired and/or wireless network, for example.

An example of a distributed computing system comprises the so-called Hadoop distributed computing system, which employs a map-reduce type of architecture. In the context of the present patent application, the terms map-reduce architecture and/or similar terms are intended to refer to a distributed computing system implementation and/or embodiment for processing and/or for generating larger sets of signal samples employing map and/or reduce operations for a parallel, distributed process performed over a network of devices. A map operation and/or similar terms refer to processing of signals (e.g., signal samples) to generate one or more key-value pairs and to distribute the one or more pairs to one or more devices of the system (e.g., network). A reduce operation and/or similar terms refer to processing of signals (e.g., signal samples) via a summary operation (e.g., such as counting the number of students in a queue, yielding name frequencies, etc.). A system may employ such an architecture, such as by marshaling distributed server devices, executing various tasks in parallel, and/or managing communications, such as signal transfers, between various parts of the system (e.g., network), in an embodiment. As mentioned, one non-limiting, but well-known, example comprises the Hadoop distributed computing system. It refers to an open source implementation and/or embodiment of a map-reduce type architecture (available from the Apache Software Foundation, 1901 Munsey Drive, Forrest Hill, Md., 21050-2747), but may include other aspects, such as the Hadoop distributed file system (HDFS) (available from the Apache Software Foundation, 1901 Munsey Drive, Forrest Hill, Md., 21050-2747). In general, therefore, "Hadoop" and/or similar terms (e.g., "Hadoop-type," etc.) refer to an implementation and/or embodiment of a scheduler for executing larger processing jobs using a map-reduce architecture over a distributed system. Furthermore, in the context of the present patent application, use of the term "Hadoop" is intended to include versions, presently known and/or to be later developed.

In the context of the present patent application, the term network device refers to any device capable of communicating via and/or as part of a network and may comprise a computing device. While network devices may be capable of communicating signals (e.g., signal packets and/or frames), such as via a wired and/or wireless network, they may also be capable of performing operations associated with a computing device, such as arithmetic and/or logic operations, processing and/or storing operations (e.g., storing signal samples), such as in memory as tangible, physical memory states, and/or may, for example, operate as a server device and/or a client device in various embodiments. Network devices capable of operating as a server device, a client device and/or otherwise, may include, as examples, dedicated rack-mounted servers, desktop computers, laptop computers, set top boxes, tablets, netbooks, smart phones, wearable devices, integrated devices combining two or more features of the foregoing devices, and/or the like, or any combination thereof. As mentioned, signal packets and/or frames, for example, may be exchanged, such as between a server device and/or a client device, as well as other types of devices, including between wired and/or wireless devices coupled via a wired and/or wireless network, for example, or any combination thereof. It is noted that the terms, server, server device, server computing device, server computing platform and/or similar terms are used interchangeably. Similarly, the terms client, client device, client computing device, client computing platform and/or similar terms are also used interchangeably. While in some instances, for ease of description, these terms may be used in the singular, such as by referring to a "client device" or a "server device," the description is intended to encompass one or more client devices and/or one or more server devices, as appropriate. Along similar lines, references to a "database" are understood to mean, one or more databases and/or portions thereof, as appropriate.

It should be understood that for ease of description, a network device (also referred to as a networking device) may be embodied and/or described in terms of a computing device and vice-versa. However, it should further be understood that this description should in no way be construed so that claimed subject matter is limited to one embodiment, such as only a computing device and/or only a network device, but, instead, may be embodied as a variety of devices or combinations thereof, including, for example, one or more illustrative examples.

A network may also include now known, and/or to be later developed arrangements, derivatives, and/or improvements, including, for example, past, present and/or future mass storage, such as network attached storage (NAS), a storage area network (SAN), and/or other forms of device readable media, for example. A network may include a portion of the Internet, one or more local area networks (LANs), one or more wide area networks (WANs), wire-line type connections, wireless type connections, other connections, or any combination thereof. Thus, a network may be worldwide in scope and/or extent. Likewise, sub-networks, such as may employ differing architectures and/or may be substantially compliant and/or substantially compatible with differing protocols, such as network computing and/or communications protocols (e.g., network protocols), may interoperate within a larger network.

In the context of the present patent application, the term sub-network and/or similar terms, if used, for example, with respect to a network, refers to the network and/or a part thereof. Sub-networks may also comprise links, such as physical links, connecting and/or coupling nodes, so as to be capable to communicate signal packets and/or frames between devices of particular nodes, including via wired links, wireless links, or combinations thereof. Various types of devices, such as network devices and/or computing devices, may be made available so that device interoperability is enabled and/or, in at least some instances, may be transparent. In the context of the present patent application, the term "transparent," if used with respect to devices of a network, refers to devices communicating via the network in which the devices are able to communicate via one or more intermediate devices, such as one or more intermediate nodes, but without the communicating devices necessarily specifying the one or more intermediate nodes and/or the one or more intermediate devices of the one or more intermediate nodes and/or, thus, may include within the network the devices communicating via the one or more intermediate nodes and/or the one or more intermediate devices of the one or more intermediate nodes, but may engage in signal communications as if such intermediate nodes and/or intermediate devices are not necessarily involved. For example, a router may provide a link and/or connection between otherwise separate and/or independent LANs.

In the context of the present patent application, a "private network" refers to a particular, limited set of devices, such as network devices and/or computing devices, able to communicate with other devices, such as network devices and/or computing devices, in the particular, limited set, such as via signal packet and/or signal frame communications, for example, without a need for re-routing and/or redirecting signal communications. A private network may comprise a stand-alone network; however, a private network may also comprise a subset of a larger network, such as, for example, without limitation, all or a portion of the Internet. Thus, for example, a private network "in the cloud" may refer to a private network that comprises a subset of the Internet. Although signal packet and/or frame communications (e.g. signal communications) may employ intermediate devices of intermediate nodes to exchange signal packets and/or signal frames, those intermediate devices may not necessarily be included in the private network by not being a source or designated destination for one or more signal packets and/or signal frames, for example. It is understood in the context of the present patent application that a private network may direct outgoing signal communications to devices not in the private network, but devices outside the private network may not necessarily be able to direct inbound signal communications to devices included in the private network.

The Internet refers to a decentralized global network of interoperable networks that comply with the Internet Protocol (IP). It is noted that there are several versions of the Internet Protocol. The term Internet Protocol, IP, and/or similar terms are intended to refer to any version, now known and/or to be later developed. The Internet includes local area networks (LANs), wide area networks (WANs), wireless networks, and/or long haul public networks that, for example, may allow signal packets and/or frames to be communicated between LANs. The term World Wide Web (WWW or Web) and/or similar terms may also be used, although it refers to a part of the Internet that complies with the Hypertext Transfer Protocol (HTTP). For example, network devices may engage in an HTTP session through an exchange of appropriately substantially compatible and/or substantially compliant signal packets and/or frames. It is noted that there are several versions of the Hypertext Transfer Protocol. The term Hypertext Transfer Protocol, HTTP, and/or similar terms are intended to refer to any version, now known and/or to be later developed. It is likewise noted that in various places in this document substitution of the term Internet with the term World Wide Web ("Web") may be made without a significant departure in meaning and may, therefore, also be understood in that manner if the statement would remain correct with such a substitution.

Although claimed subject matter is not in particular limited in scope to the Internet and/or to the Web; nonetheless, the Internet and/or the Web may without limitation provide a useful example of an embodiment at least for purposes of illustration. As indicated, the Internet and/or the Web may comprise a worldwide system of interoperable networks, including interoperable devices within those networks. The Internet and/or Web has evolved to a public, self-sustaining facility accessible to potentially billions of people or more worldwide. Also, in an embodiment, and as mentioned above, the terms "WWW" and/or "Web" refer to a part of the Internet that complies with the Hypertext Transfer Protocol. The Internet and/or the Web, therefore, in the context of the present patent application, may comprise a service that organizes stored digital content, such as, for example, text, images, video, etc., through the use of hypermedia, for example. It is noted that a network, such as the Internet and/or Web, may be employed to store electronic files and/or electronic documents.

The term electronic file and/or the term electronic document are used throughout this document to refer to a set of stored memory states and/or a set of physical signals associated in a manner so as to thereby at least logically form a file (e.g., electronic) and/or an electronic document. That is, it is not meant to implicitly reference a particular syntax, format and/or approach used, for example, with respect to a set of associated memory states and/or a set of associated physical signals. If a particular type of file storage format and/or syntax, for example, is intended, it is referenced expressly. It is further noted an association of memory states, for example, may be in a logical sense and not necessarily in a tangible, physical sense. Thus, although signal and/or state components of a file and/or an electronic document, for example, are to be associated logically, storage thereof, for example, may reside in one or more different places in a tangible, physical memory, in an embodiment.

A Hyper Text Markup Language ("HTML"), for example, may be utilized to specify digital content and/or to specify a format thereof, such as in the form of an electronic file and/or an electronic document, such as a Web page, Web site, etc., for example. An Extensible Markup Language ("XML") may also be utilized to specify digital content and/or to specify a format thereof, such as in the form of an electronic file and/or an electronic document, such as a Web page, Web site, etc., in an embodiment. Of course, HTML and/or XML are merely examples of "markup" languages, provided as non-limiting illustrations. Furthermore, HTML and/or XML are intended to refer to any version, now known and/or to be later developed, of these languages. Likewise, claimed subject matter are not intended to be limited to examples provided as illustrations, of course.

In the context of the present patent application, the term "Web site" and/or similar terms refer to Web pages that are associated electronically to form a particular collection thereof. Also, in the context of the present patent application, "Web page" and/or similar terms refer to an electronic file and/or an electronic document accessible via a network, including by specifying a uniform resource locator (URL) for accessibility via the Web, in an example embodiment. As alluded to above, in one or more embodiments, a Web page may comprise digital content coded (e.g., via computer instructions) using one or more languages, such as, for example, markup languages, including HTML and/or XML, although claimed subject matter is not limited in scope in this respect. Also, in one or more embodiments, application developers may write code (e.g., computer instructions) in the form of JavaScript (or other programming languages), for example, executable by a computing device to provide digital content to populate an electronic document and/or an electronic file in an appropriate format, such as for use in a particular application, for example. Use of the term "JavaScript" and/or similar terms intended to refer to one or more particular programming languages are intended to refer to any version of the one or more programming languages identified, now known and/or to be later developed. Thus, JavaScript is merely an example programming language. As was mentioned, claimed subject matter is not intended to be limited to examples and/or illustrations.

In the context of the present patent application, the terms "entry," "electronic entry," "document," "electronic document," "content,", "digital content," "item," and/or similar terms are meant to refer to signals and/or states in a physical format, such as a digital signal and/or digital state format, e.g., that may be perceived by a user if displayed, played, tactilely generated, etc. and/or otherwise executed by a device, such as a digital device, including, for example, a computing device, but otherwise might not necessarily be readily perceivable by humans (e.g., if in a digital format). Likewise, in the context of the present patent application, digital content provided to a user in a form so that the user is able to readily perceive the underlying content itself (e.g., content presented in a form consumable by a human, such as hearing audio, feeling tactile sensations and/or seeing images, as examples) is referred to, with respect to the user, as "consuming" digital content, "consumption" of digital content, "consumable" digital content and/or similar terms. For one or more embodiments, an electronic document and/or an electronic file may comprise a Web page of code (e.g., computer instructions) in a markup language executed or to be executed by a computing and/or networking device, for example. In another embodiment, an electronic document and/or electronic file may comprise a portion and/or a region of a Web page. However, claimed subject matter is not intended to be limited in these respects.

Also, for one or more embodiments, an electronic document and/or electronic file may comprise a number of components. As previously indicated, in the context of the present patent application, a component is physical, but is not necessarily tangible. As an example, components with reference to an electronic document and/or electronic file, in one or more embodiments, may comprise text, for example, in the form of physical signals and/or physical states (e.g., capable of being physically displayed). Typically, memory states, for example, comprise tangible components, whereas physical signals are not necessarily tangible, although signals may become (e.g., be made) tangible, such as if appearing on a tangible display, for example, as is not uncommon. Also, for one or more embodiments, components with reference to an electronic document and/or electronic file may comprise a graphical object, such as, for example, an image, such as a digital image, and/or sub-objects, including attributes thereof, which, again, comprise physical signals and/or physical states (e.g., capable of being tangibly displayed). In an embodiment, digital content may comprise, for example, text, images, audio, video, and/or other types of electronic documents and/or electronic files, including portions thereof, for example.

Also, in the context of the present patent application, the term parameters (e.g., one or more parameters) refer to material descriptive of a collection of signal samples, such as one or more electronic documents and/or electronic files, and exist in the form of physical signals and/or physical states, such as memory states. For example, one or more parameters, such as referring to an electronic document and/or an electronic file comprising an image, may include, as examples, time of day at which an image was captured, latitude and longitude of an image capture device, such as a camera, for example, etc. In another example, one or more parameters relevant to digital content, such as digital content comprising a technical article, as an example, may include one or more authors, for example. Claimed subject matter is intended to embrace meaningful, descriptive parameters in any format, so long as the one or more parameters comprise physical signals and/or states, which may include, as parameter examples, collection name (e.g., electronic file and/or electronic document identifier name), technique of creation, purpose of creation, time and date of creation, logical path if stored, coding formats (e.g., type of computer instructions, such as a markup language) and/or standards and/or specifications used so as to be protocol compliant (e.g., meaning substantially compliant and/or substantially compatible) for one or more uses, and so forth.

Signal packet communications and/or signal frame communications, also referred to as signal packet transmissions and/or signal frame transmissions (or merely "signal packets" or "signal frames"), may be communicated between nodes of a network, where a node may comprise one or more network devices and/or one or more computing devices, for example. As an illustrative example, but without limitation, a node may comprise one or more sites employing a local network address, such as in a local network address space. Likewise, a device, such as a network device and/or a computing device, may be associated with that node. It is also noted that in the context of this patent application, the term "transmission" is intended as another term for a type of signal communication that may occur in any one of a variety of situations. Thus, it is not intended to imply a particular directionality of communication and/or a particular initiating end of a communication path for the "transmission" communication. For example, the mere use of the term in and of itself is not intended, in the context of the present patent application, to have particular implications with respect to the one or more signals being communicated, such as, for example, whether the signals are being communicated "to" a particular device, whether the signals are being communicated "from" a particular device, and/or regarding which end of a communication path may be initiating communication, such as, for example, in a "push type" of signal transfer or in a "pull type" of signal transfer. In the context of the present patent application, push and/or pull type signal transfers are distinguished by which end of a communications path initiates signal transfer.

Thus, a signal packet and/or frame may, as an example, be communicated via a communication channel and/or a communication path, such as comprising a portion of the Internet and/or the Web, from a site via an access node coupled to the Internet or vice-versa. Likewise, a signal packet and/or frame may be forwarded via network nodes to a target site coupled to a local network, for example. A signal packet and/or frame communicated via the Internet and/or the Web, for example, may be routed via a path, such as either being "pushed" or "pulled," comprising one or more gateways, servers, etc. that may, for example, route a signal packet and/or frame, such as, for example, substantially in accordance with a target and/or destination address and availability of a network path of network nodes to the target and/or destination address. Although the Internet and/or the Web comprise a network of interoperable networks, not all of those interoperable networks are necessarily available and/or accessible to the public.

In the context of the particular patent application, a network protocol, such as for communicating between devices of a network, may be characterized, at least in part, substantially in accordance with a layered description, such as the so-called Open Systems Interconnection (OSI) seven layer type of approach and/or description. A network computing and/or communications protocol (also referred to as a network protocol) refers to a set of signaling conventions, such as for communication transmissions, for example, as may take place between and/or among devices in a network. In the context of the present patent application, the term "between" and/or similar terms are understood to include "among" if appropriate for the particular usage and vice-versa. Likewise, in the context of the present patent application, the terms "compatible with," "comply with" and/or similar terms are understood to respectively include substantial compatibility and/or substantial compliance.

A network protocol, such as protocols characterized substantially in accordance with the aforementioned OSI description, has several layers. These layers are referred to as a network stack. Various types of communications (e.g., transmissions), such as network communications, may occur across various layers. A lowest level layer in a network stack, such as the so-called physical layer, may characterize how symbols (e.g., bits and/or bytes) are communicated as one or more signals (and/or signal samples) via a physical medium (e.g., twisted pair copper wire, coaxial cable, fiber optic cable, wireless air interface, combinations thereof, etc.). Progressing to higher-level layers in a network protocol stack, additional operations and/or features may be available via engaging in communications that are substantially compatible and/or substantially compliant with a particular network protocol at these higher-level layers. For example, higher-level layers of a network protocol may, for example, affect device permissions, user permissions, etc.

A network and/or sub-network, in an embodiment, may communicate via signal packets and/or signal frames, such as via participating digital devices and may be substantially compliant and/or substantially compatible with, but is not limited to, now known and/or to be developed, versions of any of the following network protocol stacks: ARCNET, AppleTalk, ATM, Bluetooth, DECnet, Ethernet, FDDI, Frame Relay, HIPPI, IEEE 1394, IEEE 802.11, IEEE-488, Internet Protocol Suite, IPX, Myrinet, OSI Protocol Suite, QsNet, RS-232, SPX, System Network Architecture, Token Ring, USB, and/or X.25. A network and/or sub-network may employ, for example, a version, now known and/or later to be developed, of the following: TCP/IP, UDP, DECnet, NetBEUI, IPX, AppleTalk and/or the like. Versions of the Internet Protocol (IP) may include IPv4, IPv6, and/or other later to be developed versions.

Regarding aspects related to a network, including a communications and/or computing network, a wireless network may couple devices, including client devices, with the network. A wireless network may employ stand-alone, ad-hoc networks, mesh networks, Wireless LAN (WLAN) networks, cellular networks, and/or the like. A wireless network may further include a system of terminals, gateways, routers, and/or the like coupled by wireless radio links, and/or the like, which may move freely, randomly and/or organize themselves arbitrarily, such that network topology may change, at times even rapidly. A wireless network may further employ a plurality of network access technologies, including a version of Long Term Evolution (LTE), WLAN, Wireless Router (WR) mesh, 2nd, 3rd, or 4th generation (2G, 3G, 4G, or 5G) cellular technology and/or the like, whether currently known and/or to be later developed. Network access technologies may enable wide area coverage for devices, such as computing devices and/or network devices, with varying degrees of mobility, for example.

A network may enable radio frequency and/or other wireless type communications via a wireless network access technology and/or air interface, such as Global System for Mobile communication (GSM), Universal Mobile Telecommunications System (UMTS), General Packet Radio Services (GPRS), Enhanced Data GSM Environment (EDGE), 3GPP Long Term Evolution (LTE), LTE Advanced, Wideband Code Division Multiple Access (WCDMA), Bluetooth, ultra-wideband (UWB), 802.11b/g/n, and/or the like. A wireless network may include virtually any type of now known and/or to be developed wireless communication mechanism and/or wireless communications protocol by which signals may be communicated between devices, between networks, within a network, and/or the like, including the foregoing, of course.

Figure 15:
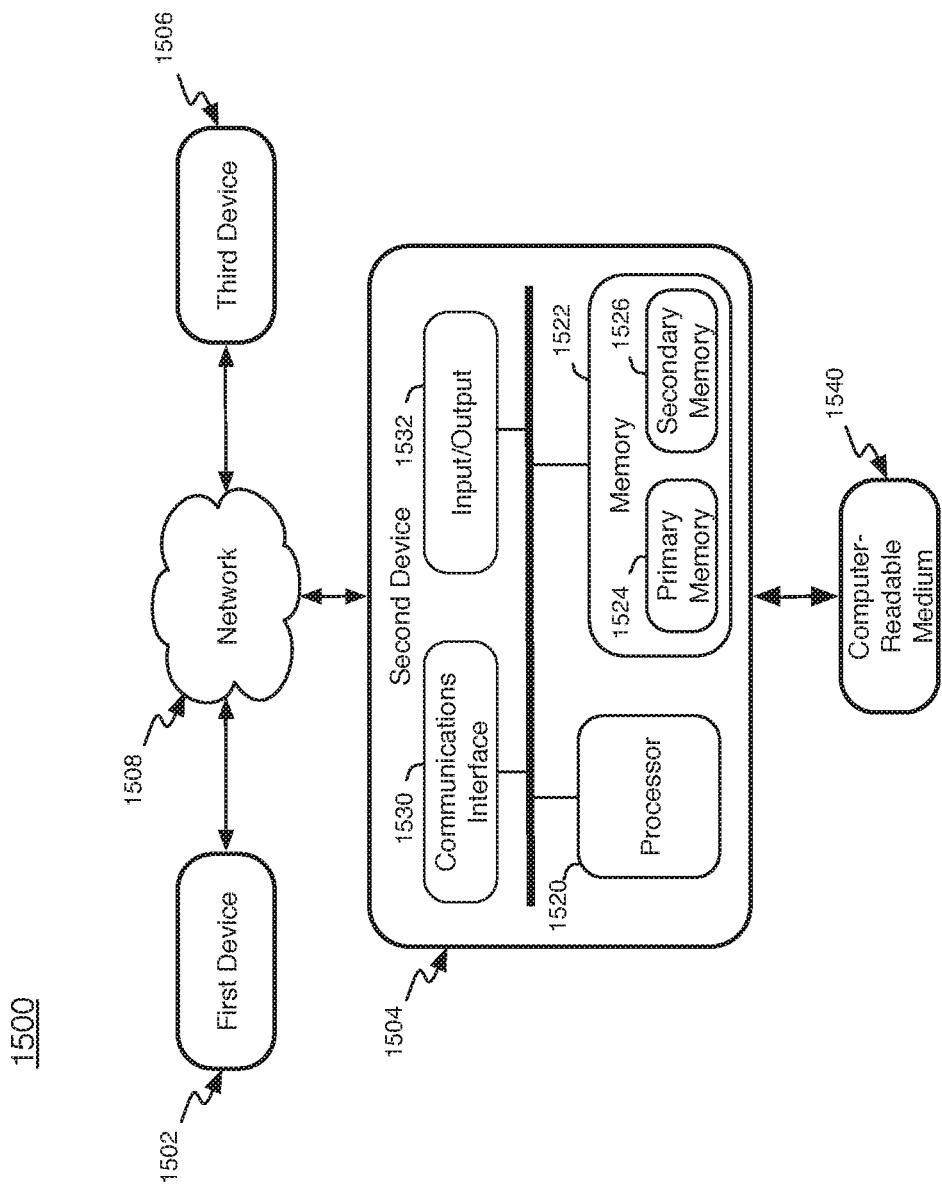
FIG. 15 is a schematic block diagram of an embodiment of a computing device.

In one example embodiment, as shown in FIG. 15, a system embodiment may comprise a local network (e.g., device 1504 and medium 1540) and/or another type of network, such as a computing and/or communications network. For purposes of illustration, therefore, FIG. 15 shows an embodiment 1500 of a system that may be employed to implement either type or both types of networks. Network 1508 may comprise one or more network connections, links, processes, services, applications, and/or resources to facilitate and/or support communications, such as an exchange of communication signals, for example, between a computing device, such as 1502, and another computing device, such as 1506, which may, for example, comprise one or more client computing devices and/or one or more server computing device. By way of example, but not limitation, network 1508 may comprise wireless and/or wired communication links, telephone and/or telecommunications systems, Wi-Fi networks, Wi-MAX networks, the Internet, a local area network (LAN), a wide area network (WAN), or any combinations thereof.

Example devices in FIG. 15 may comprise features, for example, of a client computing device and/or a server computing device, in an embodiment. It is further noted that the term computing device, in general, whether employed as a client and/or as a server, or otherwise, refers at least to a processor and a memory connected by a communication bus. Likewise, in the context of the present patent application at least, this is understood to refer to sufficient structure within the meaning of 35 USC § 112 (f) so that it is specifically intended that 35 USC § 112 (f) not be implicated by use of the term "computing device" and/or similar terms; however, if it is determined, for some reason not immediately apparent, that the foregoing understanding cannot stand and that 35 USC § 112 (f), therefore, necessarily is implicated by the use of the term "computing device" and/or similar terms, then, it is intended, pursuant to that statutory section, that corresponding structure, material and/or acts for performing one or more functions be understood and be interpreted to be described at least in FIGS. 4-13 and in the text associated at least with the foregoing figure(s) of the present patent application.

Referring now to FIG. 15, in an embodiment, first and third devices 1502 and 1506 may be capable of rendering a graphical user interface (GUI) for a network device and/or a computing device, for example, so that a user-operator may engage in system use. Device 1504 may potentially serve a similar function in this illustration. Likewise, in FIG. 15, computing device 1502 ('first device' in figure) may interface with computing device 1504 ('second device' in figure), which may, for example, also comprise features of a client computing device and/or a server computing device, in an embodiment. Processor (e.g., processing device) 1520 and memory 1522, which may comprise primary memory 1524 and secondary memory 1526, may communicate by way of a communication bus 1515, for example. The term "computing device," in the context of the present patent application, refers to a system and/or a device, such as a computing apparatus, that includes a capability to process (e.g., perform computations) and/or store digital content, such as electronic files, electronic documents, measurements, text, images, video, audio, sensor content, etc. in the form of signals and/or states. Thus, a computing device, in the context of the present patent application, may comprise hardware, software, firmware, or any combination thereof (other than software per se). Computing device 1504, as depicted in FIG. 15, is merely one example, and claimed subject matter is not limited in scope to this particular example.

For one or more embodiments, a device, such as a computing device and/or networking device, may comprise, for example, any of a wide range of digital electronic devices, including, but not limited to, desktop and/or notebook computers, high-definition televisions, digital versatile disc (DVD) and/or other optical disc players and/or recorders, game consoles, satellite television receivers, cellular telephones, tablet devices, wearable devices, personal digital assistants, mobile audio and/or video playback and/or recording devices, Internet of Things (IOT) type devices, endpoint and/or sensor nodes, gateway devices, or any combination of the foregoing. Further, unless specifically stated otherwise, a process as described, such as with reference to flow diagrams and/or otherwise, may also be executed and/or affected, in whole or in part, by a computing device and/or a network device. A device, such as a computing device and/or network device, may vary in terms of capabilities and/or features. Claimed subject matter is intended to cover a wide range of potential variations. For example, a device may include a numeric keypad and/or other display of limited functionality, such as a monochrome liquid crystal display (LCD) for displaying text, for example. In contrast, however, as another example, a web-enabled device may include a physical and/or a virtual keyboard, mass storage, one or more accelerometers, one or more gyroscopes, global positioning system (GPS) and/or other location-identifying type capability, and/or a display with a higher degree of functionality, such as a touch-sensitive color 2D or 3D display, for example.

As suggested previously, communications between a computing device and/or a network device and a wireless network may be in accordance with known and/or to be developed network protocols including, for example, global system for mobile communications (GSM), enhanced data rate for GSM evolution (EDGE), 802.11b/g/n/h, etc., and/or worldwide interoperability for microwave access (WiMAX). A computing device and/or a networking device may also have a subscriber identity module (SIM) card, which, for example, may comprise a detachable or embedded smart card that is able to store subscription content of a user, and/or is also able to store a contact list. It is noted, however, that a SIM card may also be electronic, meaning that is may simply be stored in a particular location in memory of the computing and/or networking device. A user may own the computing device and/or network device or may otherwise be a user, such as a primary user, for example. A device may be assigned an address by a wireless network operator, a wired network operator, and/or an Internet Service Provider (ISP). For example, an address may comprise a domestic or international telephone number, an Internet Protocol (IP) address, and/or one or more other identifiers. In other embodiments, a computing and/or communications network may be embodied as a wired network, wireless network, or any combinations thereof.

A computing and/or network device may include and/or may execute a variety of now known and/or to be developed operating systems, derivatives and/or versions thereof, including computer operating systems, such as Windows, iOS, Linux, a mobile operating system, such as iOS, Android, Windows Mobile, and/or the like. A computing device and/or network device may include and/or may execute a variety of possible applications, such as a client software application enabling communication with other devices. For example, one or more messages (e.g., content) may be communicated, such as via one or more protocols, now known and/or later to be developed, suitable for communication of email, short message service (SMS), and/or multimedia message service (MMS), including via a network, such as a social network, formed at least in part by a portion of a computing and/or communications network, including, but not limited to, Facebook, LinkedIn, Twitter, and/or Flickr, to provide only a few examples. A computing and/or network device may also include executable computer instructions to process and/or communicate digital content, such as, for example, textual content, digital multimedia content, sensor content, and/or the like. A computing and/or network device may also include executable computer instructions to perform a variety of possible tasks, such as browsing, searching, playing various forms of digital content, including locally stored and/or streamed video, and/or games such as, but not limited to, fantasy sports leagues. The foregoing is provided merely to illustrate that claimed subject matter is intended to include a wide range of possible features and/or capabilities.

In FIG. 15, computing device 1502 may provide one or more sources of executable computer instructions in the form physical states and/or signals (e.g., stored in memory states), for example. Computing device 1502 may communicate with computing device 1504 by way of a network connection, such as via network 1508, for example. As previously mentioned, a connection, while physical, may not necessarily be tangible. Although computing device 1504 of FIG. 15 shows various tangible, physical components, claimed subject matter is not limited to a computing devices having only these tangible components as other implementations and/or embodiments may include alternative arrangements that may comprise additional tangible components or fewer tangible components, for example, that function differently while achieving similar results. Rather, examples are provided merely as illustrations. It is not intended that claimed subject matter be limited in scope to illustrative examples.

Memory 1522 may comprise any non-transitory storage mechanism. Memory 1522 may comprise, for example, primary memory 1524 and secondary memory 1526, additional memory circuits, mechanisms, or combinations thereof may be used. Memory 1522 may comprise, for example, random access memory, read only memory, etc., such as in the form of one or more storage devices and/or systems, such as, for example, a disk drive including an optical disc drive, a tape drive, a solid-state memory drive, etc., just to name a few examples.

Memory 1522 may be utilized to store a program of executable computer instructions. For example, processor 1520 may fetch executable instructions from memory and proceed to execute the fetched instructions. Memory 1522 may also comprise a memory controller for accessing device readable-medium 1540 that may carry and/or make accessible digital content, which may include code, and/or instructions, for example, executable by processor 1520 and/or some other device, such as a controller, as one example, capable of executing computer instructions, for example. Under direction of processor 1520, a non-transitory memory, such as memory cells storing physical states (e.g., memory states), comprising, for example, a program of executable computer instructions, may be executed by processor 1520 and able to generate signals to be communicated via a network, for example, as previously described. Generated signals may also be stored in memory, also previously suggested.

Memory 1522 may store electronic files and/or electronic documents, such as relating to one or more users, and may also comprise a computer-readable medium that may carry and/or make accessible content, including code and/or instructions, for example, executable by processor 1520 and/or some other device, such as a controller, as one example, capable of executing computer instructions, for example. As previously mentioned, the term electronic file and/or the term electronic document are used throughout this document to refer to a set of stored memory states and/or a set of physical signals associated in a manner so as to thereby form an electronic file and/or an electronic document. That is, it is not meant to implicitly reference a particular syntax, format and/or approach used, for example, with respect to a set of associated memory states and/or a set of associated physical signals. It is further noted an association of memory states, for example, may be in a logical sense and not necessarily in a tangible, physical sense. Thus, although signal and/or state components of an electronic file and/or electronic document, are to be associated logically, storage thereof, for example, may reside in one or more different places in a tangible, physical memory, in an embodiment.

Algorithmic descriptions and/or symbolic representations are examples of techniques used by those of ordinary skill in the signal processing and/or related arts to convey the substance of their work to others skilled in the art. An algorithm is, in the context of the present patent application, and generally, is considered to be a self-consistent sequence of operations and/or similar signal processing leading to a desired result. In the context of the present patent application, operations and/or processing involve physical manipulation of physical quantities. Typically, although not necessarily, such quantities may take the form of electrical and/or magnetic signals and/or states capable of being stored, transferred, combined, compared, processed and/or otherwise manipulated, for example, as electronic signals and/or states making up components of various forms of digital content, such as signal measurements, text, images, video, audio, etc.

It has proven convenient at times, principally for reasons of common usage, to refer to such physical signals and/or physical states as bits, values, elements, parameters, symbols, characters, terms, numbers, numerals, measurements, content and/or the like. It should be understood, however, that all of these and/or similar terms are to be associated with appropriate physical quantities and are merely convenient labels. Unless specifically stated otherwise, as apparent from the preceding discussion, it is appreciated that throughout this specification discussions utilizing terms such as "processing," "computing," "calculating," "determining", "establishing", "obtaining", "identifying", "selecting", "generating", and/or the like may refer to actions and/or processes of a specific apparatus, such as a special purpose computer and/or a similar special purpose computing and/or network device. In the context of this specification, therefore, a special purpose computer and/or a similar special purpose computing and/or network device is capable of processing, manipulating and/or transforming signals and/or states, typically in the form of physical electronic and/or magnetic quantities, within memories, registers, and/or other storage devices, processing devices, and/or display devices of the special purpose computer and/or similar special purpose computing and/or network device. In the context of this particular patent application, as mentioned, the term "specific apparatus" therefore includes a general purpose computing and/or network device, such as a general purpose computer, once it is programmed to perform particular functions, such as pursuant to program software instructions.

In some circumstances, operation of a memory device, such as a change in state from a binary one to a binary zero or vice-versa, for example, may comprise a transformation, such as a physical transformation. With particular types of memory devices, such a physical transformation may comprise a physical transformation of an article to a different state or thing. For example, but without limitation, for some types of memory devices, a change in state may involve an accumulation and/or storage of charge or a release of stored charge. Likewise, in other memory devices, a change of state may comprise a physical change, such as a transformation in magnetic orientation. Likewise, a physical change may comprise a transformation in molecular structure, such as from crystalline form to amorphous form or vice-versa. In still other memory devices, a change in physical state may involve quantum mechanical phenomena, such as, superposition, entanglement, and/or the like, which may involve quantum bits (qubits), for example. The foregoing is not intended to be an exhaustive list of all examples in which a change in state from a binary one to a binary zero or vice-versa in a memory device may comprise a transformation, such as a physical, but non-transitory, transformation. Rather, the foregoing is intended as illustrative examples.

Referring again to FIG. 15, processor 1520 may comprise one or more circuits, such as digital circuits, to perform at least a portion of a computing procedure and/or process. By way of example, but not limitation, processor 1520 may comprise one or more processors, such as controllers, microprocessors, microcontrollers, application specific integrated circuits, digital signal processors, programmable logic devices, field programmable gate arrays, the like, or any combination thereof. In various implementations and/or embodiments, processor 1520 may perform signal processing, typically substantially in accordance with fetched executable computer instructions, such as to manipulate signals and/or states, to construct signals and/or states, etc., with signals and/or states generated in such a manner to be communicated and/or stored in memory, for example.

FIG. 15 also illustrates device 1504 as including a component 1532 operable with input/output devices, for example, so that signals and/or states may be appropriately communicated between devices, such as device 1504 and an input device and/or device 1504 and an output device. A user may make use of an input device, such as a computer mouse, stylus, track ball, keyboard, and/or any other similar device capable of receiving user actions and/or motions as input signals. Likewise, for a device having speech to text capability, a user may speak to a device to generate input signals. A user may make use of an output device, such as a display, a printer, etc., and/or any other device capable of providing signals and/or generating stimuli for a user, such as visual stimuli, audio stimuli and/or other similar stimuli.

In the preceding description, various aspects of claimed subject matter have been described. For purposes of explanation, specifics, such as amounts, systems and/or configurations, as examples, were set forth. In other instances, well-known features were omitted and/or simplified so as not to obscure claimed subject matter. While certain features have been illustrated and/or described herein, many modifications, substitutions, changes and/or equivalents will now occur to those skilled in the art. It is, therefore, to be understood that the appended claims are intended to cover all modifications and/or changes as fall within claimed subject matter.

What is claimed is:

1. An apparatus, comprising:
   a processor to obtain a plurality of signals and/or signal packets representative of a set of sensor content symbols from one or more sensors; and
   a memory coupled to the processor, wherein the memory to store a suffix lookup structure to contain a plurality of previously encoded sensor content symbols;
   the processor further to:
   encode the set of sensor content symbols at least in part via application of a processing window of an adjustable size;
   identify a match for one or more particular sensor content symbols within the suffix lookup structure, wherein the processing window to be defined at least in part based on one or more characteristics of the suffix lookup structure;

generate one or more signals and/or signal packets representative of one or more encoded sensor content symbols based at least in part on the identified match; and initiate transmission of the one or more signals and/or signal packets representative of the one or more encoded sensor content symbols to an external device.

2. The apparatus of claim 1, wherein the suffix lookup structure to comprise a least-recently used cache structure.

3. The apparatus of claim 2, wherein the processor further to store the identified match for the one or more particular sensor content symbols in the least-recently used cache structure.

4. The apparatus of claim 1, wherein the processing window to comprise a slidable processing window implemented to allow decoding by a process compliant with and/or compatible with an LZ77-type protocol.

5. The apparatus of claim 4, wherein the slidable processing window to be defined with respect to size based at least in part on a size of the suffix lookup structure.

6. The apparatus of claim 5, wherein the processor to redefine the size of the suffix lookup structure and to redefine the slidable processing window with respect to size responsive to and in accordance with the redefined size of the suffix lookup structure.

7. The apparatus of claim 1, wherein the apparatus comprises a sensor node.

8. The apparatus of claim 1, further comprising a transceiver circuit to transmit the one or more signals and/or signal packets representative of the one or more encoded content symbols to a gateway device via a wireless connection compatible with and/or compliant with a low power long range wide area network protocol.

9. A method, comprising:
obtaining, at a processor of a sensor node, a plurality of signals and/or signal packets representative of a set of sensor content symbols from one or more sensors;
storing signals and/or states representative of a suffix lookup structure in a memory of the sensor node, wherein the suffix lookup structure contains a plurality of previously encoded sensor content symbols;
encoding, utilizing at least in part the processor, the set of sensor content symbols at least in part by applying a processing window of an adjustable size, wherein the encoding further includes identifying a match for one or more particular sensor content symbols within the suffix lookup structure, wherein the processing window is defined at least in part based on one or more characteristics of the suffix lookup structure;
generating, utilizing at least in part the processor, one or more signals and/or signal packets representative of one or more encoded sensor content symbols based at least in part on the identified match; and
initiating transmission of the one or more signals and/or signal packets representative of the one or more encoded sensor content symbols to an external device.

10. The method of claim 9, wherein the suffix lookup structure comprises a least-recently used cache structure to store the identified match for the one or more particular sensor content symbols.

11. The method of claim 9, wherein the processing window comprises a slidable processing window implemented to allow decoding by a process compliant with and/or compatible with an LZ77-type protocol.

12. The method of claim 11, further comprising defining the slidable processing window with respect to size based at least in part on a size of the suffix lookup structure.

13. The method of claim 12, further comprising redefining the size of the suffix lookup structure and redefining the slidable processing window with respect to size responsive to and/or in accordance with the redefined size of the suffix lookup structure.

14. The method of claim 9, further comprising transmitting the one or more signals and/or signal packets representative of the one or more encoded content symbols to a gateway device via a wireless connection compatible with and/or compliant with a low power long range wide area network protocol.

15. A system, comprising:
one or more sensor nodes to individually include at least one processor to obtain a plurality of signals and/or signal packets representative of a set of sensor content symbols from one or more sensors and further to include a memory coupled to the at least one processor to store a suffix lookup structure to contain a plurality of previously encoded sensor content symbols, wherein the at least one processor to encode the set of sensor content symbols at least in part via application of a slidable processing window of an adjustable size, wherein the processing window to be defined at least in part based on one or more characteristics of the suffix lookup structure; and
a gateway device to obtain the encoded set of sensor content symbols from the one or more sensor nodes via a wireless connection, wherein the gateway device to further encode the encoded set of sensor content symbols and to transmit one or more signals and/or signal packets representative of the further encoded set of sensor content symbols to a network device over a network.

16. The system of claim 15, wherein the at least one processor of the one or more sensor nodes to encode the set of sensor content symbols to allow decoding by a process compliant with and/or compatible with an LZ77-type protocol.

17. The system of claim 16, wherein the gateway device to further encode the set of sensor content symbols to allow decoding by a process in substantial compliance with and/or compatible with a Huffman-type encoding protocol.

18. The system of claim 16, wherein the slidable processing window to be defined with respect to size based at least in part on a size of the suffix lookup structure.

19. The system of claim 18, wherein the at least one processor of the one or more sensor nodes to redefine the size of the suffix lookup structure and to redefine the slidable processing window with respect to size responsive to and in accordance with the redefined size of the suffix lookup structure.

20. The system of claim 15, wherein the gateway device to further include a content storage structure to store the encoded set of sensor content symbols to be obtained from the one or more sensor nodes and wherein the suffix lookup structure of the one or more sensor nodes and the content storage structure of the gateway device to comprise conflict-free replicated content types, wherein the one or more sensor nodes and the gateway device to independently and/or concurrently to maintain consistency of the suffix lookup structure and the content storage structure, respectively.

* * * * *